(12) United States Patent
Uenishi

(10) Patent No.: US 6,884,571 B2
(45) Date of Patent: Apr. 26, 2005

(54) INTERMEDIATE LAYER COMPOSITION FOR THREE-LAYER RESIST PROCESS AND PATTERN FORMATION METHOD USING THE SAME

(75) Inventor: Kazuya Uenishi, Shizuoka (JP)

(73) Assignee: Fuji Photo Film Co., LTD, Kanagawa (JP)

( * ) Notice: Subject to any disclaimer, the term of this patent is extended or adjusted under 35 U.S.C. 154(b) by 41 days.

(21) Appl. No.: 10/392,814

(22) Filed: Mar. 21, 2003

(65) Prior Publication Data
US 2003/0207208 A1 Nov. 6, 2003

(30) Foreign Application Priority Data

Mar. 22, 2002 (JP) .................................... P. 2002-081328

(51) Int. Cl.$^7$ .......................... G03C 1/76; C08F 283/12; C08G 77/08
(52) U.S. Cl. ................. 430/323; 430/272.1; 430/270.1; 430/330; 525/474; 525/477
(58) Field of Search .............................. 430/323, 272.1, 430/270.1, 330; 525/474, 477

(56) References Cited

U.S. PATENT DOCUMENTS 6,743,885 B1 * 6/2004 Yahagi et al. ................. 528/40

FOREIGN PATENT DOCUMENTS

| JP | 4-43264 | 7/1992 |
|---|---|---|
| JP | 4-44741 | 7/1992 |
| JP | 6-38400 | 5/1994 |
| JP | 2573371 | 10/1996 |
| JP | 2641644 | 5/1997 |
| JP | 2901044 | 3/1999 |

\* cited by examiner

Primary Examiner—John A. McPherson
Assistant Examiner—Daborah Chacko-Davis

(57) ABSTRACT

An intermediate layer composition for a three-layer resist process comprising (A) an octakis(silsesquioxane) skeleton-containing polymer obtained by hydrosilylation polymerization of a compound represented by formula (I) defined in the specification with bis(substituted ethynyl) compound in the presence of a platinum-containing catalyst.

9 Claims, No Drawings

INTERMEDIATE LAYER COMPOSITION FOR THREE-LAYER RESIST PROCESS AND PATTERN FORMATION METHOD USING THE SAME

FIELD OF THE INVENTION

The present invention relates to lithographic technology by which a micro pattern is formed with a high degree of accuracy on a substrate in the fabrication of a semiconductor integrated circuit, and particularly to an intermediate layer material for a three-layer resist process and a pattern formation method using the same.

BACKGROUND OF THE INVENTION

With the progress of increased integration of semiconductor integrated circuits, resist patterns have been increasingly required to be miniaturized and raised in accuracy in lithographic processes. In order to comply with such a requirement, it has been intended to go ahead with the development of techniques for shortening the wavelengths of light sources toward the enhancement of resolution from conventional near-ultraviolet lights such as g-lines and i-lines to excimer laser beams such as KrF, ArF and $F_2$, EUV lights and X-rays, in exposure methods.

On the other hand, a lowering of the dimensional accuracy of resist patterns caused by fluctuations in resist film thickness based on step profile of a substrate, which are generated in the fabrication of the semiconductor integrated circuits, has become a problem. This problem has been canalized to be alleviated by recent developments in CMP techniques of grinding the substrate having step profile to flatten. Aside from this, a more serious problem has been encountered. Based on the shortened wavelengths of the exposure light sources, the light absorption of resist materials becomes increasingly strong, so that it becomes impossible to use conventional aromatic ring-based organic polymeric materials. Further, it has been required to decrease thickness of resist film, in order to reduce light absorption and widen a process window of lithography. Thus, conventional monolayer resist processes can no longer ensure sufficient dry etching resistance, thereby making it impossible to process a substrate with a high degree of accuracy.

As a solution for these problems, a three-layer resist process has been watched.

The three-layer resist process includes the following processes:

(a) A lower resist layer containing an organic material is formed on a substrate to be processed;

(b) An intermediate layer and an upper resist layer containing an organic material crosslinkable or decomposable by radiation exposure are successively laminated on the lower resist layer; and (c) After the formation of a specified pattern on the upper resist layer, the intermediate layer, the lower resist layer and the substrate are successively etched.

As a material for the intermediate layer used, an organopolysiloxane (silicone resin) or a $SiO_2$ coating solution (SOG) has hitherto been known.

There are further reported an intermediate layer material using an improved organopolysiloxane material (JP-B-4-43264 (the term "JP-B" as used herein means an "examined Japanese patent publication")), an intermediate layer material using a silicon compound such as $Si(OH)_4$ (JP-B-6-38400), an intermediate layer material containing a sylilated product of a clay mineral (Japanese Patent No. 2,573,371), an intermediate layer material containing a mixture of a halogenosilane or a an organohalogenosilane and ammonia or an amine (Japanese Patent No. 2,641,644), an intermediate layer material containing a polysiloxane derivative (Japanese Patent No. 2,901,044) and an intermediate layer material containing an organopolysilsesquioxane (JP-B-4-44741).

However, these intermediate layer materials are essentially poor in storage stability, and an upper layer resist pattern formed on the intermediate layers has a footing profile. Accordingly, they have the critical problem that line edge roughness (LER) is deteriorated when the intermediate layer is etched using the upper layer resist pattern as a mask.

SUMMARY OF THE INVENTION

An object of the invention is to provide an intermediate layer material for a three-layer resist process which overcomes the problems in the prior art.

Another object of the invention is to provide an intermediate layer composition for a three-layer resist process which is soluble in an organic solvent, excellent in storage stability, and has no problem with regard to a footing profile and line edge roughness in patterning of an upper layer resist.

A further object of the invention is to provide a pattern formation method using the intermediate layer composition.

As a result of intensive studies made while giving attention to the above-described characteristics, the present inventors have completed the invention. That is to say, the objects of the invention can be attained by the following constitutions:

(1) An intermediate layer composition for a three-layer resist process comprising (A) an octakis(silsesquioxane) skeleton-containing polymer obtained by hydrosilylation polymerization of a compound represented by the following formula (I) with a compound represented by the following formula (II) in the presence of a platinum-containing catalyst:

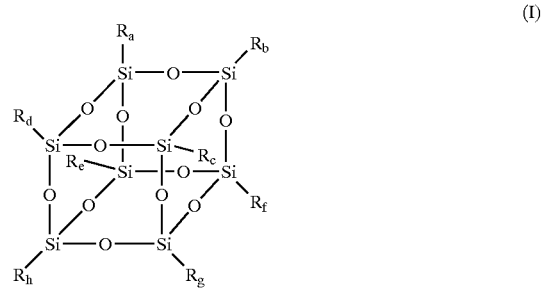

(I)

wherein $R_a$ to $R_h$ each independently represent a hydrogen atom, a halogen atom or an alkyl group, and at least two of $R_a$ to $R_h$ are hydrogen atoms;

(II)

wherein $R_1$ and $R_3$ each independently represent a monovalent organic or organometallic group, $R_2$ represents a bivalent organic or organometallic group, and a represents 0 or 1.

DETAILED DESCRIPTION OF THE INVENTION

The invention also include the following constitutions:

(2) The composition described in item (1), wherein the polymer of component (A) is obtained by hydrosilylation polymerization of pentacyclo[$9.5.1.1^{3,9}.1^{5,15}.1^{7,13}$] octasiloxane (PCOSI) with the compound represented by formula (II) in a molar ratio of 2:1 to 1:4 in the presence of a platinum-containing catalyst.

(3) The composition described in item (1) or (2), which further comprises (B) a radical initiator.

(4) The composition described in any one of items (1) to (3), which further comprises (C) a crosslinking agent.

(5) The composition described in any one of items (1) to (4), which further comprises (D) a compound generating an acid by heat.

(6) The composition described in any one of items (1) to (5), which further comprises (E) a solvent.

(7) The composition described in any one of items (1) to (6), which further comprises (F) a surfactant.

(8) A pattern formation method in a three-layer resist process comprising the steps of:

(a) forming a lower resist layer containing an organic material on a substrate;

(b) successively laminating an intermediate layer and an upper resist layer containing an organic material crosslinkable or decomposable by radiation exposure on the lower resist layer; and (c) successively etching the intermediate layer, the lower layer and the substrate, after the formation of a pattern on the upper resist layer, wherein the intermediate layer comprises the composition described in any one of items (1) to (7).

(9) The pattern formation method described in item (8), wherein a coating film comprising the intermediate layer composition is baking at high temperature to insolubilize in an organic solvent.

The invention will be explained in more detail below.

(1) Component (A) Used in the Invention

The intermediate layer composition for a three-layer resist process of the invention is a composition containing an octakis(silsesquioxane) skeleton-containing polymer obtained by hydrosilylation polymerization of a compound represented by the above-described formula (I) with a compound represented by the above-described formula (II) in the presence of a platinum-containing catalyst.

The alkyl group for each of $R_a$ to $R_h$ in formula (I) is preferably an alkyl group having from 1 to 4 carbon atoms, such as methyl, ethyl or propyl.

In formula (II), $R_1$ and $R_3$ each independently represent a monovalent organic or organometallic group, and $R_2$ represents a bivalent organic or organometallic group. The monovalent organic or organometallic group for $R_1$ and $R_3$ and the bivalent organic or organometallic group for $R_2$ may each have a substituent.

Specific examples of $R_1$ and $R_3$ include, for example, an aryl group (preferably having from 5 to 16 carbon atoms, for example, phenyl, tolyl, xylyl, biphenyl, naphthyl, anthryl or phenanthryl), an alkyl group (preferably having from 1 to 20 carbon atoms, for example, methyl, ethyl, propyl, butyl, pentyl, hexyl, heptyl, octyl, nonyl, decyl, dodecyl, tetradecyl or heptadecyl), an alkoxycarbonyl group (preferably having from 2 to 6 carbon atoms, for example, methoxycarbonyl, ethoxycarbonyl, propoxycarbonyl or butoxycarbonyl) and an organic silicon group (preferably having from 1 to 23 carbon atoms, for example, trimethylsilyl, triethylsilyl, tripropylsilyl, dimethylphenylsilyl or tribenzylsilyl).

Further, specific examples of $R_2$ include, for example, an arylene group (preferably having from 6 to 14 carbon atoms, for example, phenylene, naphthylene, biphenylene or diphenyl ether), a heterocyclic group (for example, pyridylene or thienylene), an alkylene group (preferably having from 1 to 10 carbon atoms, fro example, methylene, ethylene or 2,2-propylene), a dimethyl ether group, a silylene group (for example, dimethylsilylene, diethylsilylene or diphenylsilylene), a siloxane group (for example, tetramethyl(disiloxane)), a carbosilane group (for example, phenylbis(dimethylsilylene)) and a ferrocenylene group.

When a is 0, two acetylene groups are directly bonded to each other.

Examples of the bis (substituted ethynyl) compound include bis(phenylethynyl)benzene, bis(naphthylethynyl)benzene, bis(methylethynyl)benzene, bis(tert-butylethynyl)benzene, bis(hexylethynyl)benzene, bis(phenylethynyl)naphthalene, bis(phenylethynyl)biphenyl, bis(phenylethynylphenyl)ether, bis(phenylethynyl)pyridylene, bis(phenylethynyl)thiophene, bis(trimethylsilylethynyl)benzene, bis(trimethylsilyl)butadiyne, bis(phenylethynyl)dimethylsilane, bis(phenylethynyl)diphenylsilane, bis(phenylethynyl)tetramethyldisiloxane, bis(methylethyl)tetramethyldisiloxane, bis[(phenylethynyl)dimethylsilyl]benzene and bis(phenylethynyl)ferrocene.

Component (A) obtained by the above-described reaction is a polymer represented by the following formula (III):

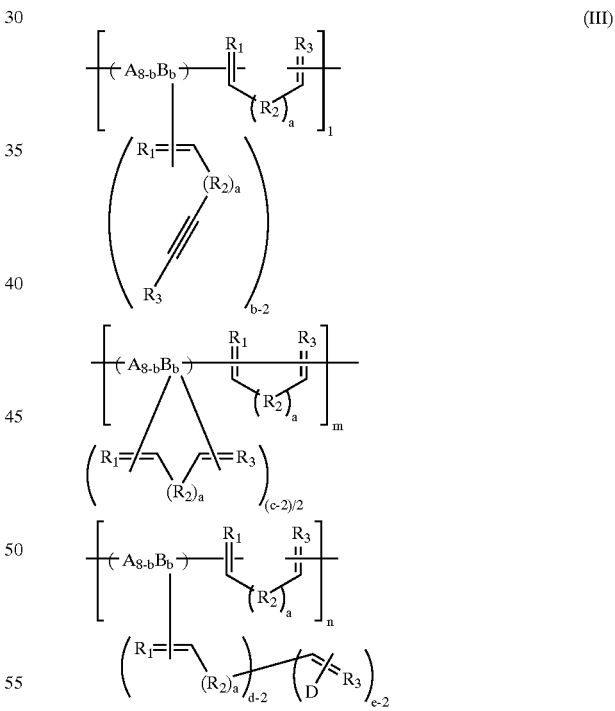

(III)

wherein $R_1$ and $R_3$ each independently represent a monovalent organic or organometallic group which may have a substituent; $R_2$ represents a bivalent organic or organometallic group which may have a substituent; a represents 0 or 1; b represents 2, 3 or 4; c represents 2 or 4; d represents 2, 3 or 4; e represents 2, 3 or 4; l, m and n each represent 0 or a positive integer, provided that at least one of l, m and n represents an integer of 2 or more; D represents another PCOSI skeleton; A represents —($HSiO_{3/2}$)—; and B represents —($SiO_{3/2}$)—.

In formula (III), a structure represented by the following formula (IV) includes four structures represented by the following formula (V):

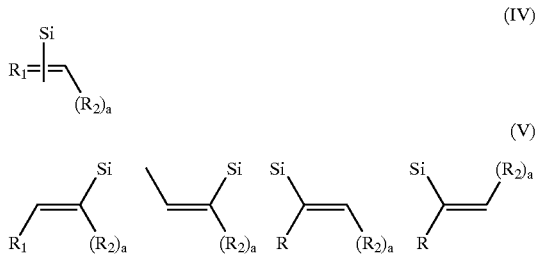

R₁, R₂ and R₃ in formula (III) have the same meanings as defined for R₁, R₂ and R₃ in formula (II), respectively.

The polymer represented by formula (III), which is used in the invention, can be synthesized as a silsesquioxane-containing polymer having a PCOSI skeleton by hydrosilylation polymerization of the above-described bis(substituted ethynyl) compound with PCOSI according to, for example, a manufacturing method described in JP-A-9-296043 (the term "JP-A" as used herein means an "unexamined published Japanese patent application").

The PCOSI described above is a cyclic polysiloxane compound represented by $(HSiO_{3/2})_8$ or $H_8Si_8O_{12}$. An —O— bond exists between two Si's, three oxygen atoms and one hydrogen atom are bonded to each Si, and eight SiH bonds exist in a molecule. The hydrosilylation reaction of the PCOSI with the bis(substituted ethynyl) compound represented by formula (II) results in the occurrence of polymerization to provide a polymer having heat resistance and solvent solubility.

The polymer of the invention is a solid polymer obtained by hydrosilylation polymerization of the PCOSI with the bis(substituted ethynyl) compound represented by formula (II) in a molar ratio of 2:1 to 1:4, having heat resistance and solvent solubility, and represented by the above-described formula (III). The average polymerization degree of the polymer is from 5 to 20,000, and preferably from 10 to 10,000.

A platinum-containing catalyst is used in the hydrosilylation polymerization reaction. As the platinum-containing catalyst, that conventionally used in the hydrosilylation reaction can be used. Examples of the catalyst include platinum-divinylsiloxane, platinum-cyclic vinylmethylsiloxane, tris (dibenzylideneacetone) diplatinum, chloroplatinic acid, bis(ethylene) tetrachlorodiplatinum, cyclooctadienechloroplatinum, bis (cyclooctadiene) platinum, bis(dimethylphenylphosphine) dichloroplatinum, tetrakis(triphenylphosphine)platinum and platinum carbon.

In the hydrosilylation polymerization reaction, various solvents conventionally used in the reaction can be used. Examples of the solvent include toluene, benzene, hexane and ether.

The hydrosilylation polymerization reaction can be conducted at various temperatures from 0° C. to a boiling point of the solvent, and can be conducted at room temperature without particular heating or cooling.

The ratio of the PCOSI to the bis(substituted ethynyl) compound in the reaction is usually from 2:1 to 1:4, and preferably from 1.5:1 to 1:2, by a molar ratio, from the viewpoints of the yield and solubility.

The PCOSI skeleton-containing polymer represented by the above-described formula is obtained by the above-described hydrosilylation polymerization reaction. At least one of the degrees of polymerization, l, m and n of the polymer is 2 or more, each is ordinarily from 5 to 10,000, and preferably from 10 to 5,000.

The polymer of component (A) is dissolved in an solvent as described below for coating, and used as a composition for an intermediate layer.

Now, components preferably contained in the composition of the invention will be described below.

(2) Component (B) Used in the Invention

The composition of the invention can contain a commercially available radical initiator (e.g., azo initiator, peroxide) as the radical initiator (B). The amount of component (B) used is usually from 0.0005% to 5% by weight, and preferably from 0.0007% to 1% by weight, based on the solid content of the intermediate layer composition.

The radical initiator as component (B) includes the following compounds.

As the radical initiators, those ordinarily used such as peroxides and azo initiators are usable. The azo initiators are preferred. The azo initiators include 2,2'-azobis(4-methoxy-2,4-dimethylvaleronitrile), 2,2'-azobis(2-cyclopropylpropionitrile), 2,2'-azobis(2,4-dimethylvaleronitrile), 2,2'-azobisisobutyronitrile, 2,2'-azobis(2-methylbutyronitrile), 1,1'-azobis(cyclohexane-1-carbonitrile), 2,2'-azobis(2-methyl-N-phenylpropionamidine) dihydrochloride, 2,2'-azobis(2-methyl-N-2-propenylpropionamidine) dihydrochloride, 2,2'-azobis[2-(5-methyl-2-imidazoline-2-yl)propane] dihydrochloride, 2,2'-azobis{2-methyl-N-[1,1-bis(hydroxymethyl)-2-hydroxyet hyl]propionamide}, dimethyl-2,2'-azobis(2-methylpropionate), 4,4'-azobis(4-cyanovaleric acid) and 2,2'-azobis(2-(hydroxymethyl) propionitrile.

As the radical initiators, 2,2'-azobis(2,4-dimethylvaleronitrile), 2,2'-azobisisobutyronitrile, 2,2'-azobis(2-methylbutyronitrile), 1,1'-azobis(cyclohexane-1-carbonitrile), dimethyl-2,2'-azobis(2-methylpropionate), 4,4'-azobis(4-cyanovaleric acid) and 2,2'-azobis(2-(hydroxymethyl)propionitrile are preferred.

(3) Crosslinking Agent (Component C) Used in the Invention

The intermediate layer composition of the invention can contain a compound which is crosslinkable upon an acid (hereinafter also referred to as an acid crosslinking agent, or simply as a crosslinking agent sometimes).

(3)-1 Phenol derivatives can be used as the crosslinking agents. Preferably, the crosslinking agent include a phenol derivative having a molecular weight of 1,200 or below, containing 3 to 5 benzene rings per molecule, and having 2 or more hydroxymethyl or alkoxymethyl groups in total, wherein the hydroxymethyl groups or alkoxymethyl groups are bonded collectively to at least any one of the benzene rings, or distributively to the benzene rings. The use of such a phenol derivative makes the effect of the invention more significant.

The alkoxymethyl group bonded to the benzene ring is preferably an alkoxymethyl group having 6 or less carbon atoms. Specifically, methoxymethyl, ethoxymethyl, n-propoxymethyl, i-propoxymethyl, n-butoxymethyl, i-butoxymethyl, sec-butoxy-methyl and tert-butoxymethyl are preferred. Further, an alkoxy-substituted alkoxy group such as 2-methoxyethoxy or 2-methoxy-1-propoxy is also preferred.

Of the phenol derivatives, those particularly preferred are described below.

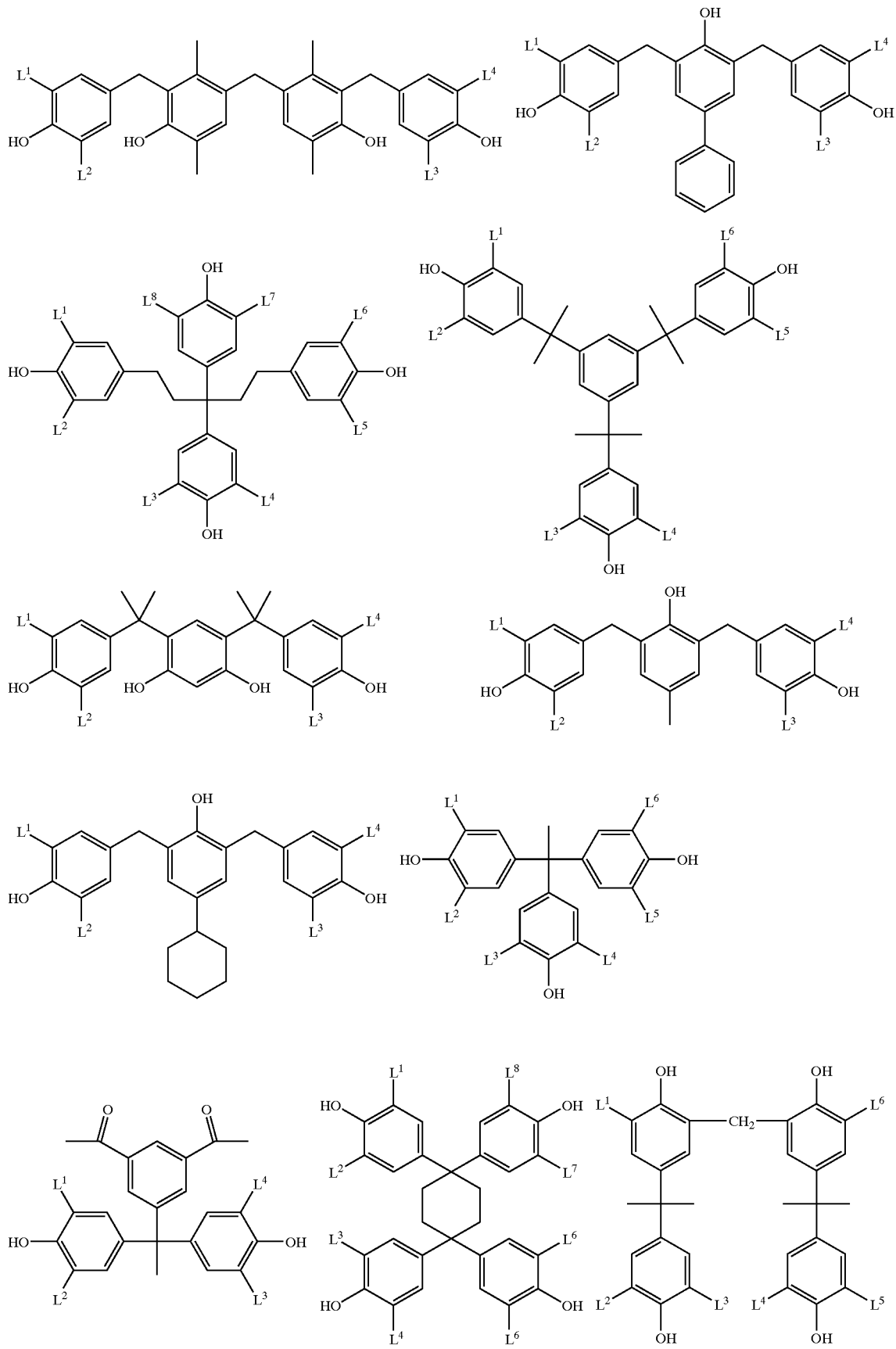

-continued
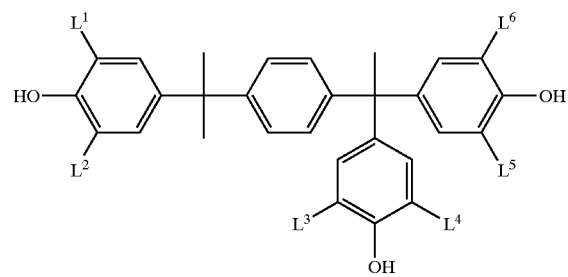
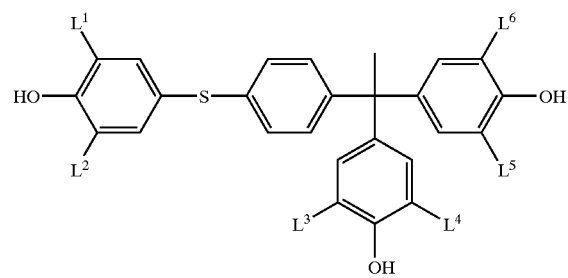
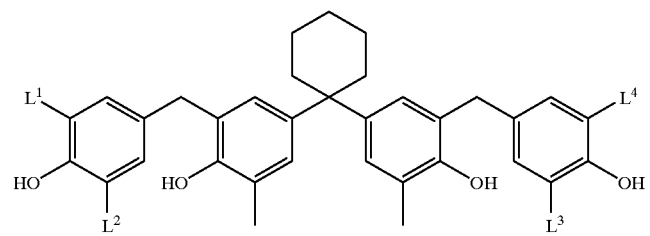
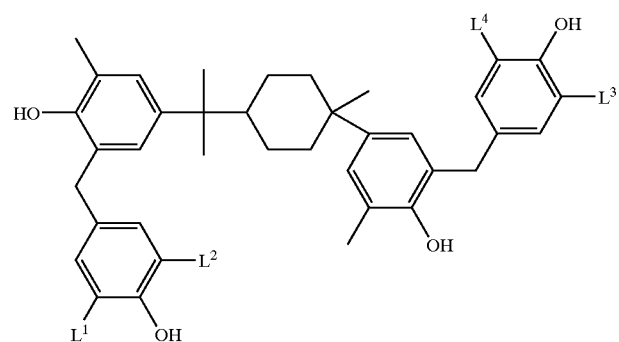
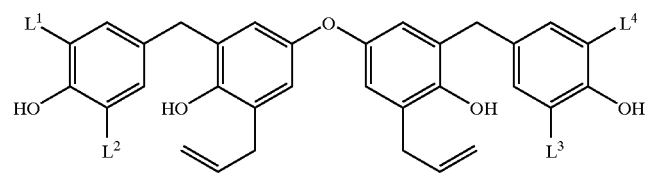
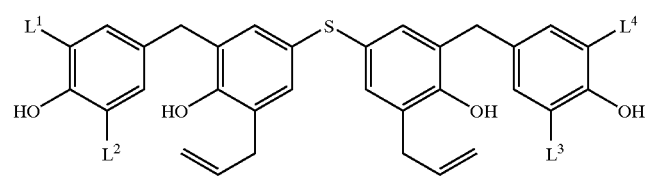
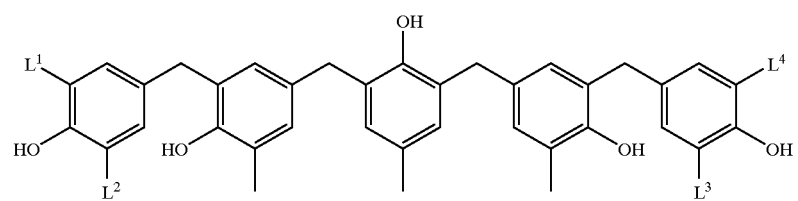

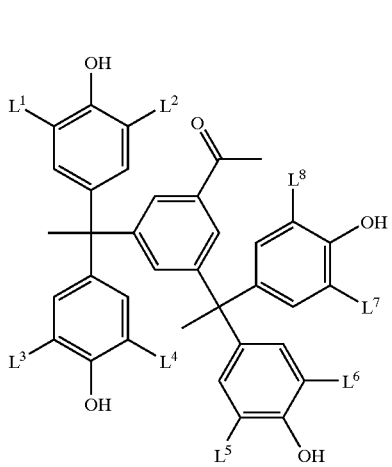
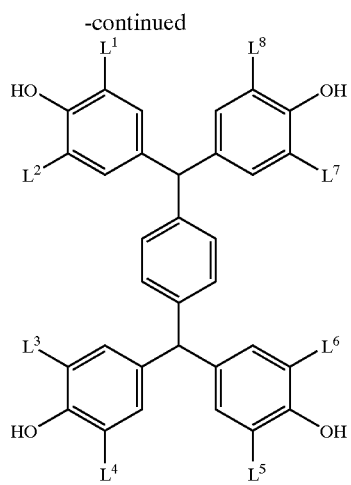

wherein, $L^1$ to $L^8$, which may be the same or different, each represent a hydroxymethyl group, a methoxymethyl group or an ethoxymethyl group.

The hydroxymethyl group-containing phenol derivative can be obtained by reacting a corresponding phenol compound having no hydroxymethyl group (compound in which $L^1$ to $L^8$ are hydrogen atoms in the above-describe formulas) with formaldehyde in the presence of a base catalyst. In this case, in order to prevent resinification and gelation, it is preferred that the reaction is conducted at a reaction temperature of 60° C. or less. Specifically, the derivative can be synthesized by methods described in JP-A-6-282067 and JP-A-7-64285.

The alkoxymethyl group-containing phenol derivative can be obtained by reacting a corresponding phenol compound having hydroxymethyl groups with an alcohol in the presence of an acid catalyst. In this case, in order to prevent resinification and gelation, it is preferred that the reaction is conducted at a reaction temperature of 100° C. or less. Specifically, the derivative can be synthesized by methods described in EP-A-632,003 (the term "EP-A" as used herein means an "unexamined published European patent application").

The hydroxymethyl group- or alkoxymethyl group-containing phenol derivative is preferred in view of stability in storage, the alkoxymethyl group-containing phenol derivative is particularly preferred from the viewpoint of stability in storage.

The phenol derivatives each having 2 or more hydroxymethyl groups or alkoxymethyl groups in total, wherein the hydroxymethyl groups or alkoxymethyl groups are bonded collectively to any one of the benzene rings, or distributively to the benzene rings, may be used alone or as a combination of two or more thereof.

(3)-2 In addition to the above-described phenol derivative, a compound of the following (i) or (ii) can be used as the crosslinking agent.

(i) A compound having an N-hydroxymethyl group, an N-alkoxymethyl group or an N-acyloxymethyl group, and (ii) An epoxy compound.

These crosslinking agents will be described in detail below.

(i) The compound having an N-hydroxymethyl group, an N-alkoxymethyl group or an N-acyloxymethyl group includes a melamine-formaldehyde reactant monomer, a melamine-formaldehyde condensate oligomer and a urea-formaldehyde condensate described in EP-A-133,216, West German Patents 3,634,671 and 3,711,264, and a benzoguanamine-formaldehyde condensate described in EP-A-212,482.

Also, a glycoluryl derivative represented by the following formula can be used.

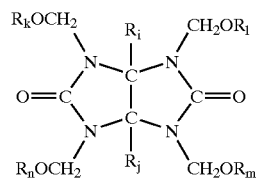

$R_i$, $R_j$: H, $C_1$ to $C_4$ alkyl
$R_k$ to $R_n$: H, $CH_3$, $CH_2CH_3$

More preferred examples thereof include, for example, a melamine-formaldehyde derivative having at least two free N-hydroxymethyl groups, N-alkoxymethyl groups and N-acyloxyethyl groups. An N-alkoxymethyl derivative is particularly preferred.

(ii) The epoxy compound includes a monomer, a dimer, an oligomer and a polymer of epoxy compound, each having one or more epoxy groups. The epoxy compound includes, for example, a reaction product of bisphenol A with epichlorohydrin, and a reaction product of a low molecular weight phenol-formaldehyde resin with epichlorohydrin. In addition, epoxy resins described in U.S. Pat. No. 4,026,705 and British Patent 1,539,192 are exemplified.

In the invention, the above-described phenol derivative is preferred.

In addition to the above-described phenol derivative, for example, other crosslinking agents, for example, crosslinking agent (i) or (ii) as described above can be used together. The ratio of the above-described phenol derivative to the other crosslinking agent usable in combination is from 100/0 to 20/80., preferably from 90/10 to 40/60, and more preferably from 80/20 to 50/50, in the molar ratio.

The crosslinking agent is used in an amount of 3 to 70% by weight, and preferably in an amount added of 5% to 50% by weight, based on the solid content of intermediate layer composition. When the amount of the crosslinking agent added is less than 3% by weight, film thickness retention is decreased. On the other hand, the amount exceeding 70% by weight results in unfavorable stability of the intermediate layer composition.

(4) Compound Decomposed by Heat to Generate an Acid (Component D)

The intermediate layer composition of the invention can contain a compound decomposed by heat to generate an acid (hereinafter also referred to as an acid generating agent sometimes).

In the invention, the acid generating agent means a compound which generates an acid by heating at a temperature of 100° C. or more. The acid generating agent suitably used in the invention can be appropriately selected from known compounds which generate acids by heat decomposition, for example, photoinitiators for cationic photopolymerization, photoinitiators for radical photopolymerization, photodecoloring agents and photodiscloring agents for dye, and know acid generating agents used in micro resist, and mixtures thereof.

The acid generating agents include, for example, onium salts such as diazonium salts described in S. I. Schlesinger, *Photogr. Sci. Eng.*, 18, 387 (1974) and T. S. Bal et al., *Polymer*, 21, 423 (1980), ammonium salts described in U.S. Pat. Nos. 4,069,055, 4,069,056 and Re 27,992, and JP-A-4-365049, phosphonium salts described in D. C. Necker et al., *Macromolecules*, 17, 2468 (1984), C. S. Wen et al., *Teh. Proc. Conf. Rad. Curing ASIA*, p. 478, Tokyo, October (1988), U.S. Pat. Nos. 4,069,055 and 4,069,056, iodonium salts described in J. V. Crivello et al., *Macromolecules*, 10 (6), 1307 (1977), *Chem. & Eng. News*, Nov. 28, 31 (1988), European Patents 104,143, 339,049 and 410,201, JP-A-2-150848 and JP-A-2-296514, sulfonium salts described in J. V. Crivello et al., *Polymer, J.* 17, 73 (1985), J. V. Crivello et al., *J. Org. Chem.*, 43, 3055 (1978), W. R. Watt et al., *J. Polymer Sci., Polymer Chem. Ed.*, 22, 1789 (1984), J. V. Crivello et al., *Polymer Bull.*, 14, 279 (1985), J. V. Crivello et al., *Macromolecules*, 14 (5), 1141 (1981), J. V. Crivello et al., *J. Polymer Sci., Polymer Chem. Ed.*, 17, 2877 (1979), European Patents 370,693, 390,214, 233,567, 297,443, 297, 442, 161,811, 410,201 and 339,049, U.S. Pat. Nos. 4,933, 377, 4,760,013, 4,734,444 and 2,833,827, German Patents 2,904,626, 3,604,580 and 3,604,581, selenonium salts described in J. V. Crivello et al., *Macromolecules*, 10 (6), 1307 (1977) and J. V. Crivello et al., *J. Polymer Sci., Polymer Chem. Ed.*, 17, 1047 (1979) and arsonium salts described in C. S. Wen et al., *Teh. Proc. Conf. Rad. Curing ASIA*, p. 478, Tokyo, October (1988); organic halogen compounds described in U.S. Pat. No. 3,905,815, JP-B-46-4605, JP-A-48-36281, JP-A-55-32070, JP-A-60-239736, JP-A-61-169835, JP-A-61-169837, JP-A-62-58241, JP-A-62-212401, JP-A-63-70243 and JP-A-63-298339; organic metals/organic halides described in K. Meier et al., *J. Rad. Curing*, 13 (4), 26 (1986), T. P. Gill et al., *Inorg. Chem.*, 19, 3007 (1980), D. Astruc, *Acc. Chem. Res.*, 19 (12), 377 (1986) and JP-A-2-161445, photoacid generating agents having o-nitrobenzyl type protecting group described in S. Hayase et al.,*J. Polymer Sci.*, 25, 753 (1987), E. Reichmanis et al.,*J. Polymer Sci., Polymer Chem. Ed.*, 23, 1 (1985), Q. Q. Zhuetal.,*J. Photochem.*, 36, 85, 39, 317 (1987), B. Amit et al., *Tetrahedron Lett.*, (24), 2205 (1973), D. H. R. Barton et al., *J. Chem. Soc.*, 3571 (1965), P. M. Collins et al., *J. Chem. Soc.*, Perkin 1,1695 (1975), M. Rudinstein et al., *Tetrahedron Lett.*, (17), 1445 (1975), J. W. Walker et al.,*J. Am. Chem. Soc.*, 110, 7170 (1988), S. C. Busman et al.,*J. Imaging Technol.*, 11 (4), 191 (1985), H. M. Houlihan et al., *Macromolecules*, 21, 2001 (1988), P. M. Collins et al., *J. Chem. Soc., Chem. Commun.*, 532 (1972), S. Hayaseetal., *Macromolecules*, 18, 1799 (1985), E. Reichmanis et al., *J. Electrochem. Soc., Solid State Sci. Technol.*, 130 (6), F. M. Houlihan et al.,*Macromolecules*, 21, 2001 (1988), European Patents 290,750, 046,083, 156,535, 271,851 and 388,343, U.S. Pat. Nos. 3,901,710 and 4,181,531, JP-A-60-198538 and JP-A-53-133022; compounds producing sulfonic acids by photolysis which are represented by iminosulfonates described in M. Tunooka et al., *Polymer Preprints Japan*, 38 (8), G. Berner et al., *J. Rad. Curing*, 13 (4), W. J. Mijs et al., *Coating Technol.*, 55 (697), 45 (1983), Akzo, H. Adachi et al., *Polymer Preprints Japan*, 37(3), European Patents 199, 672, 084,515, 199,672, 044,115 and 101,122, U.S. Pat. Nos. 4,618,564, 4,371,605 and 4,431,774, JP-A-64-18143, JP-A-2-245756 and JP-A-4-365048; and disulfone compounds described in JP-A-61-166544.

Also, polymer compounds in which these groups or compounds generating acids with light are introduced into their main chains or side chains can be used. Examples of such compounds are described in M. E. Woodhouse et al.,*J. Am. Chem. Soc.*, 104, 5586 (1982), S. P. Pappas et al., *J. Imaging Sci.*, 30 (5), 218 (1986), S. Kondo et al., *Makromol. Chem., Rapid Commun.*, 9, 625 (1988), Y. Yamada et al., *Makromol. Chem.*, 152, 153, 163 (1972), J. V. Crivello et al., *J. Polymer Sci., Polymer Chem. Ed.*, 17, 3845 (1979), U.S. Pat. No. 3,849,137, German Patent 3,914,407, JP-A-63-26653, JP-A-55-164824, JP-A-62-69263, JP-A-63-146037, JP-A-63-163452, JP-A-62-153853 and JP-A-63-146029.

Further, compounds generating acids with light can also be used which are described in V. N. R. Pillai, *Synthesis*, (1) 1 (1980), A. Abad et al., *Tetrahedron Lett.*, (47), 4555 (1971), D. H. R. Barton et al., *J. Chem. Soc.*, (C), 329 (1970), U.S. Pat. No. 3,779,778 and European Patent 126, 712.

Of these, the acid generating agents preferably used in the invention include compounds represented by the following formulas (I) to (V):

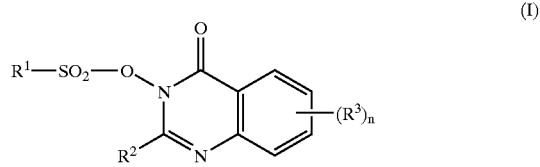

(I)

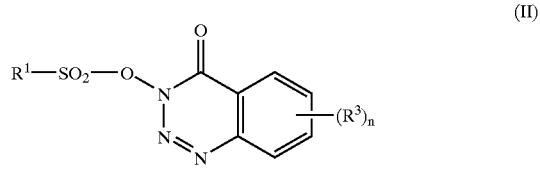

(II)

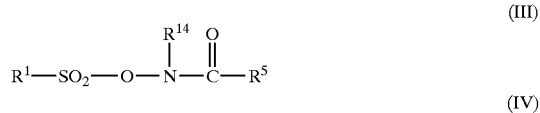

(III)

(IV)

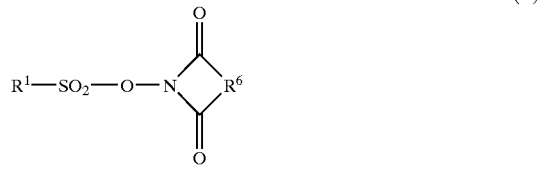

(V)

wherein $R^1$, $R^2$, $R^4$ and $R^5$, which may be the same or different, each represent a hydrocarbon group having 20 or less carbon atoms, which may have a substituent; $R^3$ represents a halogen atom, a hydrocarbon group having 10 or less carbon atoms, which may have a substituent, or an alkoxy group having 10 or less carbon atoms; $Ar^1$ and $Ar^2$, which may be the same or different, each represent an aryl group having 20 or less carbon atoms, which may have a substituent; $R^6$ represents a divalent hydrocarbon group having 20 or less carbon atoms, which may have a substituent; and n represents an integer of from 0 to 4.

In the above-described formulas (I) to (V), $R^1$, $R^2$, $R^4$ and $R^5$ each independently represent a hydrocarbon group having 20 or less carbon atoms, which may have a substituent, and preferably represents a hydrocarbon group having from 1 to 14 carbon atoms.

Specific examples of the hydrocarbon group include an alkyl group such as methyl, ethyl, n-propyl, isopropyl, n-butyl, sec-butyl, tert-butyl, hexyl, cyclohexyl, octyl, 2-ethylhexyl, undecyl and dodecyl; an alkenyl group such as-allyl, vinyl, 1-methylvinyl and 2-phenylvinyl; an aralkyl group such as benzyl; andanarylgroupsuchasphenyl, tolyl, xylyl, cumenyl, mesityl, dodecylphenyl, phenylphenyl, naphthyl and anthryl.

The hydrocarbon group may have a substituent, for example, a halogen atom, an alkoxy group, a nitro group, a cyano group or a carboxy group. Specific examples of the substituent-containing hydrocarbon group include trifluoromethyl, chloroethyl, 2-methoxyethyl, fluorophenyl, chlorophenyl, bromophenyl, iodophenyl, methoxyphenyl, phenoxyphenyl, methoxyphenylvinyl, nitrophenyl, cyanophenyl, carboxyphenyl and 9,10-dimethoxyanthryl.

$R^3$ represents a halogen atom, a hydrocarbon group having 10 or less carbon atoms (for example, an alkyl group, an alkenyl group, an aralkyl group or an aryl group), which may have a substituent, or an alkoxy group having 10 or less carbon atoms. Specific examples thereof include a halogen atom such as fluorine, chlorine, bromine and iodine; a hydrocarbon group such as methyl, ethyl, n-propyl, i-propyl, allyl, n-butyl, sec-butyl, tert-butyl, hexyl, cyclohexyl, benzyl, phenyl and tolyl; a substituent-containing hydrocarbon group such as 2-methoxyethyl, fluorophenyl, chlorophenyl, bromophenyl, iodophenyl and methoxyphenyl; and an alkoxy group such as methoxy and ethoxy.

Further, when n is 2 or more, two adjacent $R^3$'s may be bonded to each other to form a condensed ring.

$Ar^1$ and $Ar^2$, which may be the same or different, each represent an aryl group having 20 or less carbon atoms, which may have a substituent, and preferably an aryl group having from 6 to 14 carbon atoms.

Specific examples thereof include phenyl, tolyl, xylyl, cumenyl, mesityl, dodecylphenyl, phenylphenyl, naphthyl, fluorophenyl, chlorophenyl, bromophenyl, iodophenyl, chloronaphthyl, methoxyphenyl, phenoxyphenyl, ethoxynaphthyl, nitrophenyl, cyanophenyl, carboxyphenyl, nitronaphthyl and anthryl.

$R^6$ represents a divalent hydrocarbon group having 20 or less carbon atoms, which may have a substituent. Examples of the divalent hydrocarbon group include an alkylene group, an alkenylene group, an aralkylene group and an arylene group.

Specific examples thereof include ethynylene, 1,2-cyclohexenylene, 1,2-phenylene, 4-chloro-1,2-phenylene, 4-nitro-1,2-phenylene, 4-methyl-1,2-phenylene, 4-methoxy-1,2-phenylene, 4-carboxy-1,2-phenylene and 1,8-naphthalenylene.

n represents an integer of from 0 to 4. When n is 0, $R^3$ is not present.

Of the compounds represented by formulas (I) to (V), preferred compounds are enumerated below.

These compounds can be synthesized by methods described in JP-A-2-100054 and JP-A-2-100055.

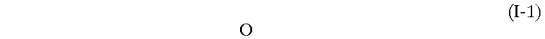

(I-1)

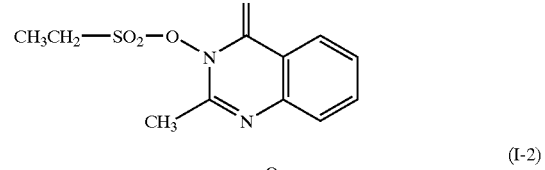

(I-2)

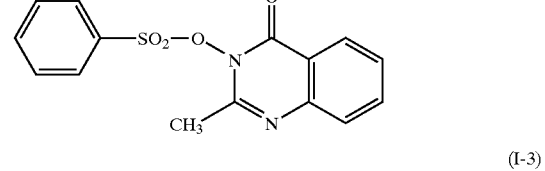

(I-3)

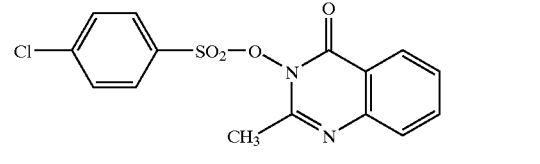

(I-4)

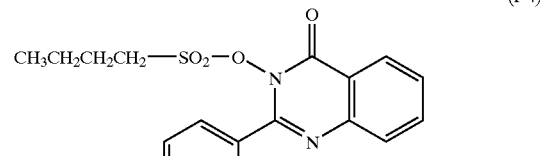

(I-5)

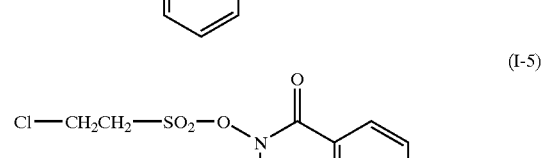

(I-6)

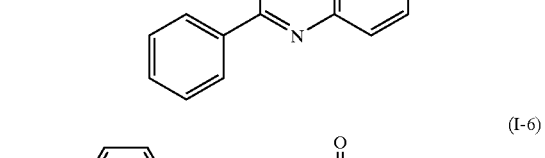

(I-7)

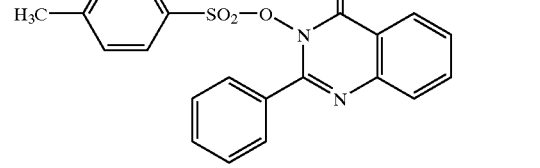

(I-8)

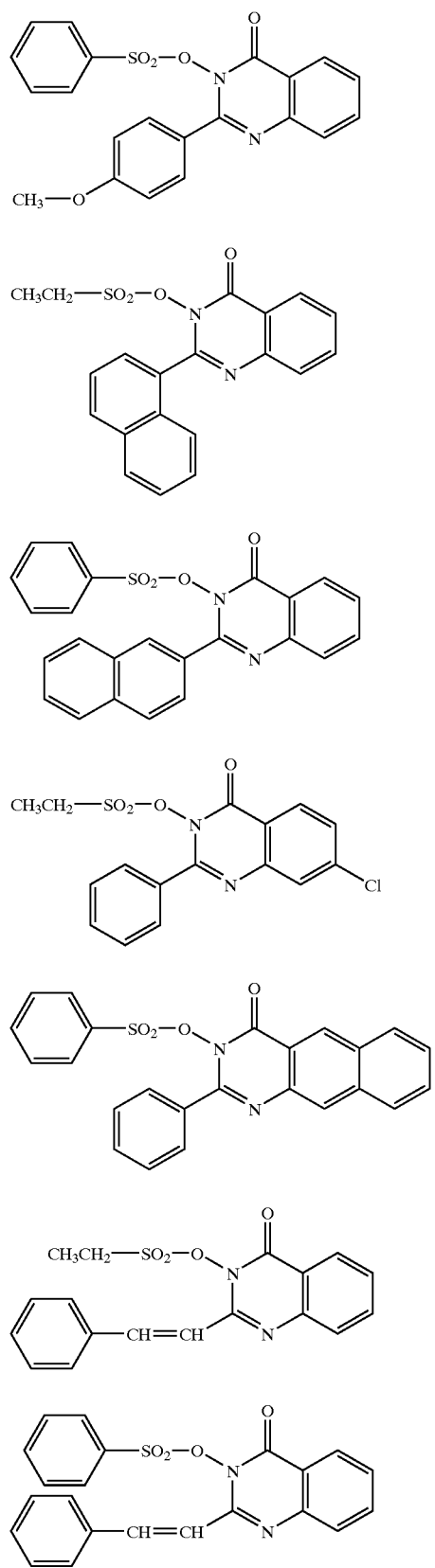
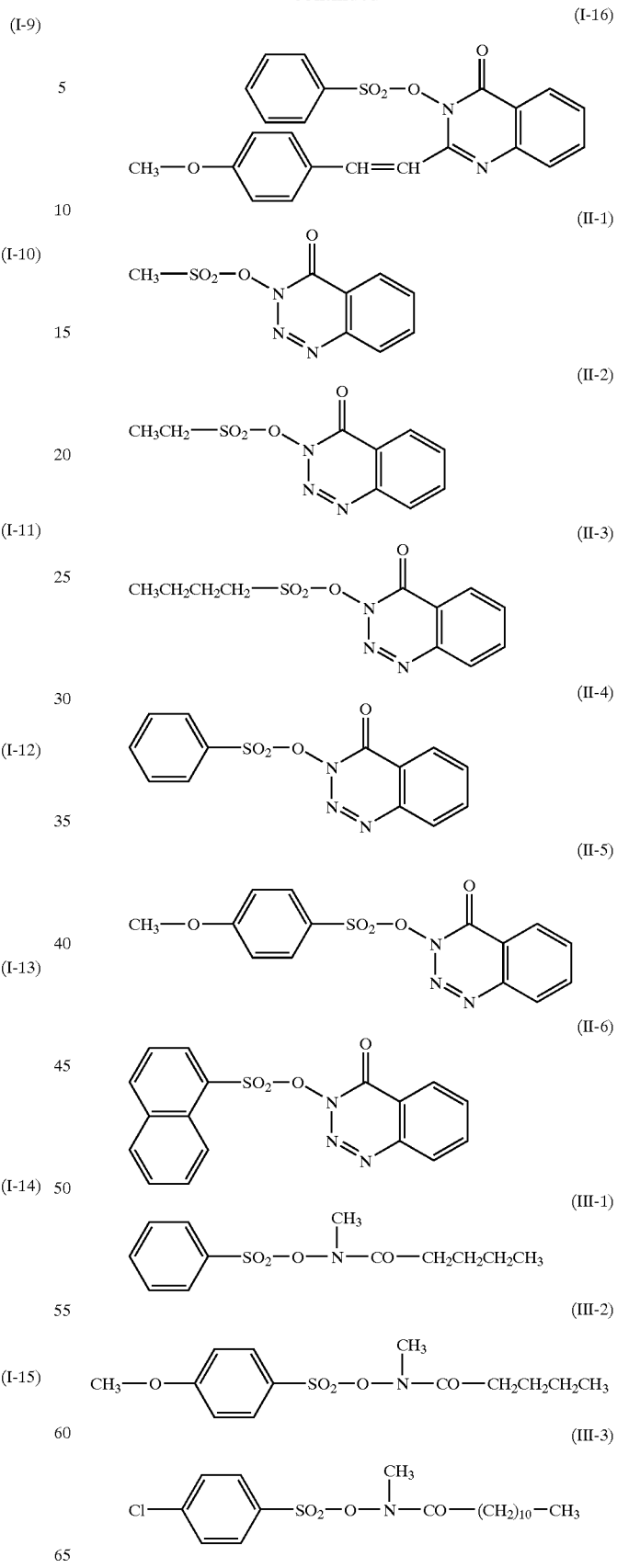

-continued
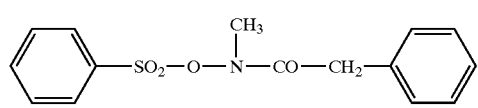 (III-4)
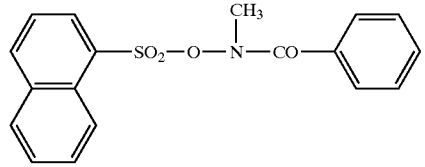 (III-5)
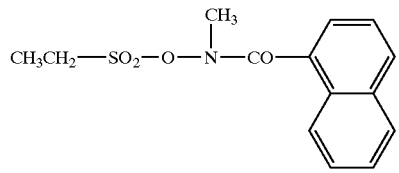 (III-6)
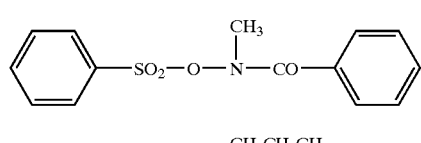 (III-7)
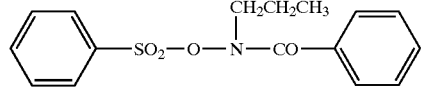 (III-8)
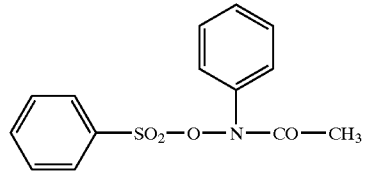 (III-9)
 (III-10)
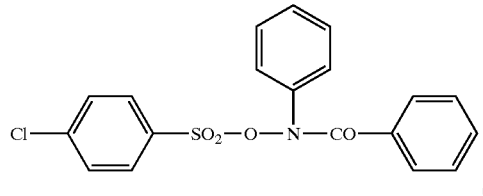 (III-11)
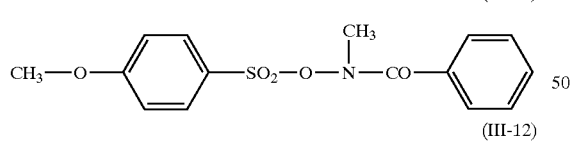 (III-12)
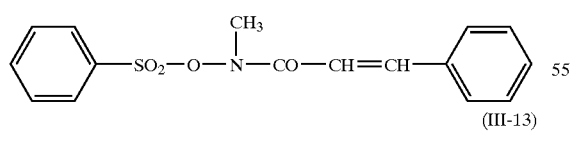 (III-13)
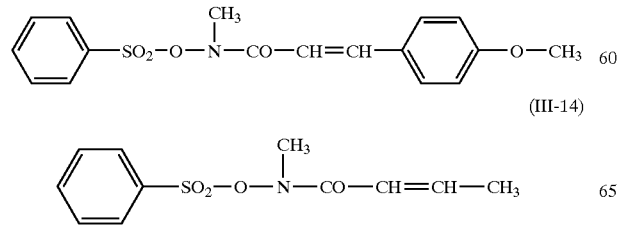 (III-14)
-continued
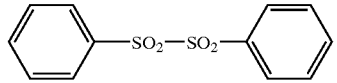 (IV-1)
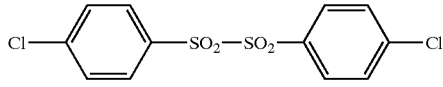 (IV-2)
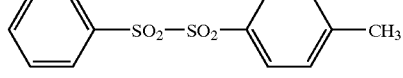 (IV-3)
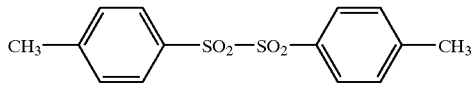 (IV-4)
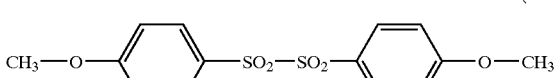 (IV-5)
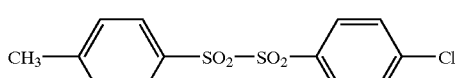 (IV-6)
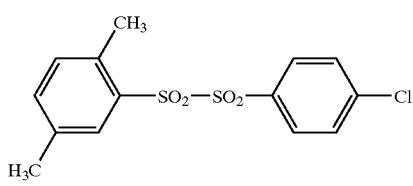 (IV-7)
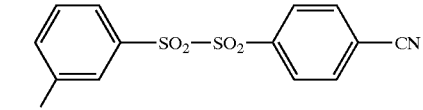 (IV-8)
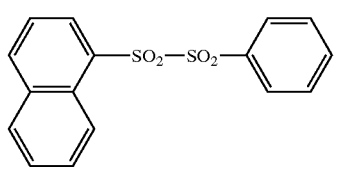 (IV-9)
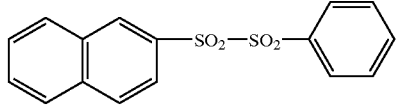 (IV-10)
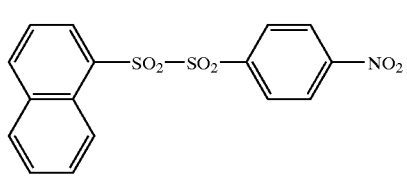 (IV-11)
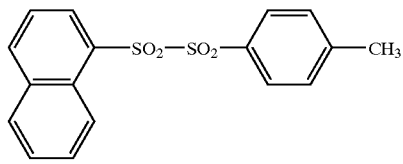 (IV-12)

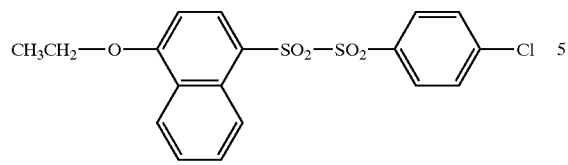
(IV-13)
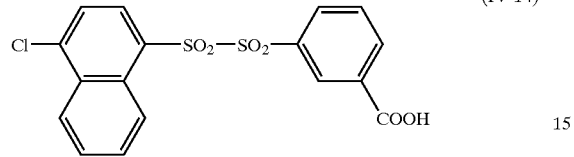
(IV-14)
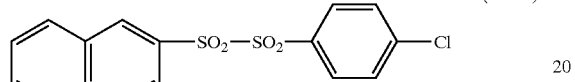
(IV-15)
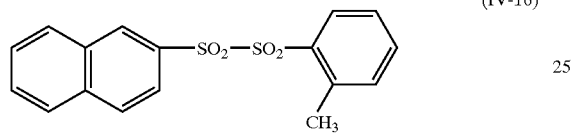
(IV-16)
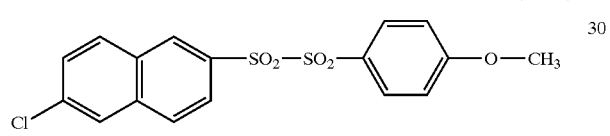
(IV-17)
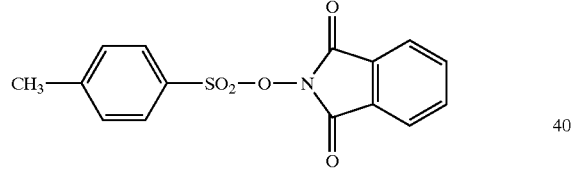
(V-1)
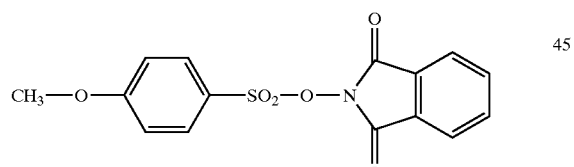
(V-2)
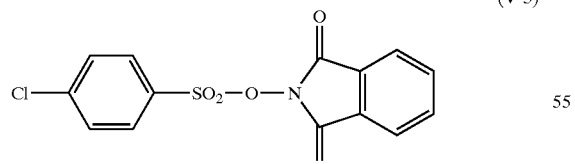
(V-3)
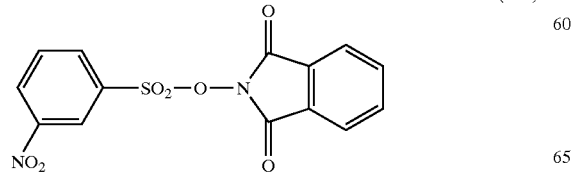
(V-4)
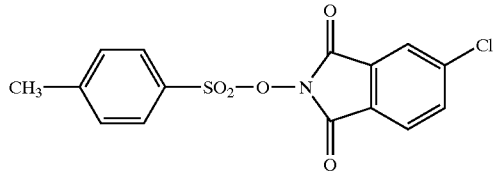
(V-5)
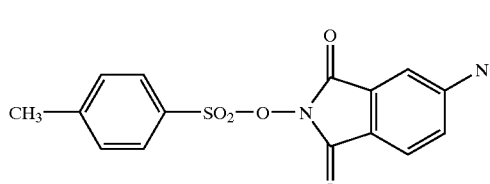
(V-6)
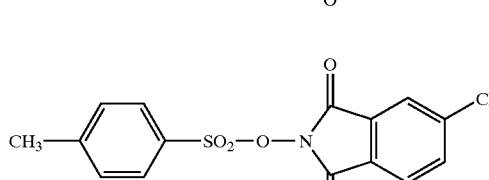
(V-7)
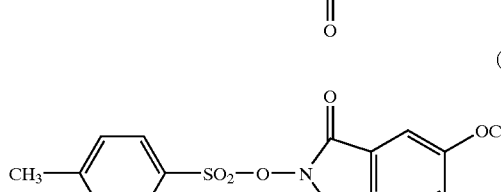
(V-8)
(V-9)
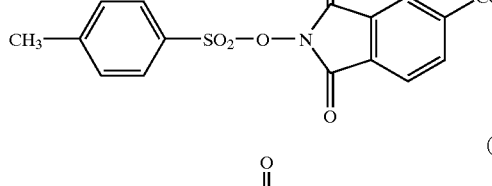
(V-10)
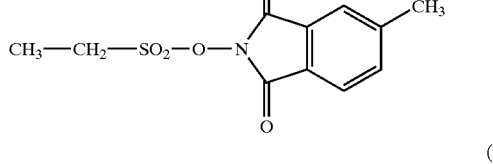
(V-11)
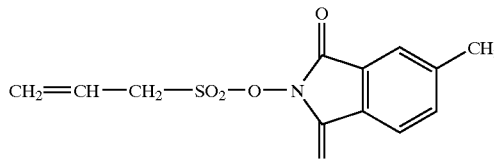
(V-12)

(V-13)
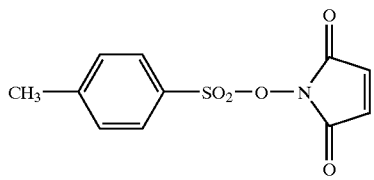

(V-14)
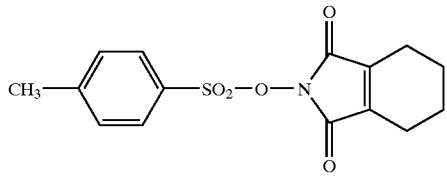

(V-15)
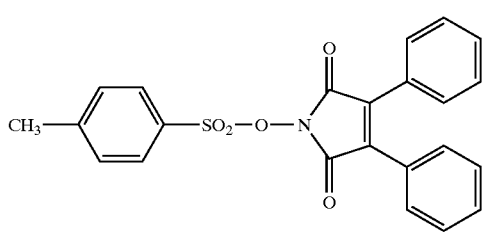

(V-16)
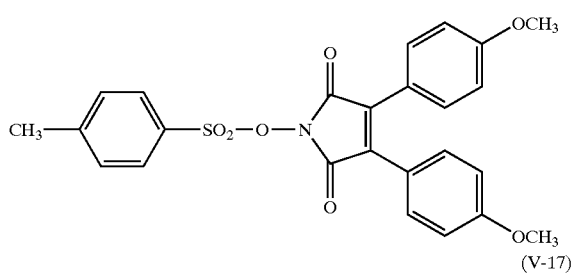

(V-17)
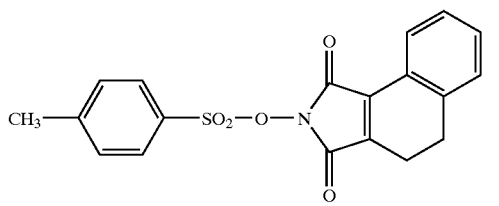

(V-18)
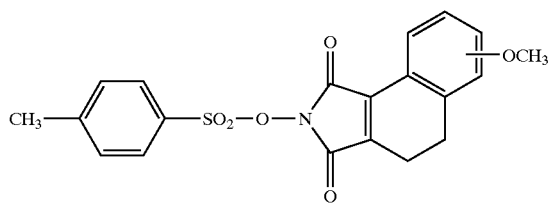

The compound decomposed by heat to generate an acid (Component D) suitably used includes also an onium salt having a halide or a sulfonic acid as a counter ion, preferably an iodonium salt represented by the following formula (VI), a sulfonium salt represented by the following formula (VII) and a diazonium salt represented by the following formula (VIII):

(VI)
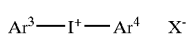

(VII)
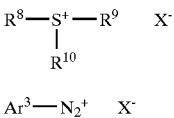

(VIII)
Ar³—N₂⁺   X⁻ wherein X⁻ is a halide ion, $ClO_4^-$, $PF_6^-$, $SbF_6^-$, $BF_4^-$ or $R^7\text{—}SO_3^-$, $R^7$ represents a hydrocarbon group having 20 or less carbon atoms, which may have a substituent, $Ar^3$ and $Ar^4$ each represent an aryl group having 20 or less carbon atoms, which may have a substituent, and $R^8$, $R^9$ and R10 each represent a hydrocarbon group having 18 or less carbon atoms, which may have a substituent.

In the above-described formulas, $R^7\text{—}SO_3^-$ is particularly preferably used as X⁻, wherein $R^7$ represents a hydrocarbon group having 20 or less carbon atoms, which may have a substituent. Specific examples of the hydrocarbon group represented by $R^7$ include an alkyl group such as methyl, ethyl, n-propyl, isopropyl, n-butyl, sec-butyl, tert-butyl, hexyl, cyclohexyl, octyl, 2-ethylhexyl and dodecyl; an alkenyl group such as allyl, vinyl, 1-methylvinyl and 2-phenylvinyl; an aralkyl group such as benzyl and phenethyl; and an aryl group such as phenyl, tolyl, xylyl, cumenyl, mesityl, dodecylphenyl, phenylphenyl, naphthyl and anthryl.

The hydrocarbon group may have a substituent such as a halogen atom, a hydroxy group, an alkoxy group, an aryloxy group, a nitro group, a cyano group, a carbonyl group, a carboxy group, an alkoxycarbonyl group, an anilino group or acetamido group. Specific examples of the substituent-containing hydrocarbon group include trifluoromethyl, 2-methoxyethyl, 10-camphonyl, fluorophenyl, chlorophenyl, bromophenyl, iodophenyl, methoxyphenyl, hydroxyphenyl, phenoxyphenyl, nitrophenyl, cyanophenyl, carboxyphenyl, methoxynaphthyl, dimethoxyanthrnyl, diethoxyanthryl and anthraquinonyl.

$Ar^3$ and $Ar^4$ each represent an aryl group having 20 or less carbon atoms, which may have a substituent. Specific examples thereof include phenyl, tolyl, xylyl, cumenyl, mesityl, dodecylphenyl, phenylphenyl, naphthyl, anthryl, fluorophenyl, chlorophenyl, bromophenyl, iodophenyl, methoxyphenyl, hydroxyphenyl, phenoxyphenyl, nitrophenyl, cyanophenyl, carboxyphenyl, anilinophenyl, anilinocarbonylphenyl, morpholinophenyl, phenylazophenyl, methoxynaphthyl, hydroxynaphthyl, nitronaphthyl and anthraquinonyl.

$R^8$, $R^9$ and $R^{10}$ each represent a hydrocarbon group having 18 or less carbon atoms, which may have a substituent. Specific examples thereof include a hydrocarbon group such as methyl, ethyl, n-propyl, isopropyl, allyl, n-butyl, sec-butyl, tert-butyl, hexyl, cyclohexyl, benzyl, phenyl, tolyl, tert-butylphenyl, naphthyl and anthryl; and a substituent-containing hydrocarbon group such as 2-methoxyethyl, fluorophenyl, chlorophenyl, bromophenyl, iodophenyl, methoxyphenyl, hydroxyphenyl, phenylthiophenyl, hydroxynaphthyl, methoxynaphthyl, benzoylmethyl and naphthoylmethyl.

Also, $R^8$ and $R^9$ may combine with each other to form a ring.

A cation moiety of the onium salt represented by any one of formulas (VI) to (VIII) includes an iodonium ion, a sulfonium ion and a diazonium ion. As for the cation moiety of the onium salt, specific structures are shown below, but the invention is not limited thereto.

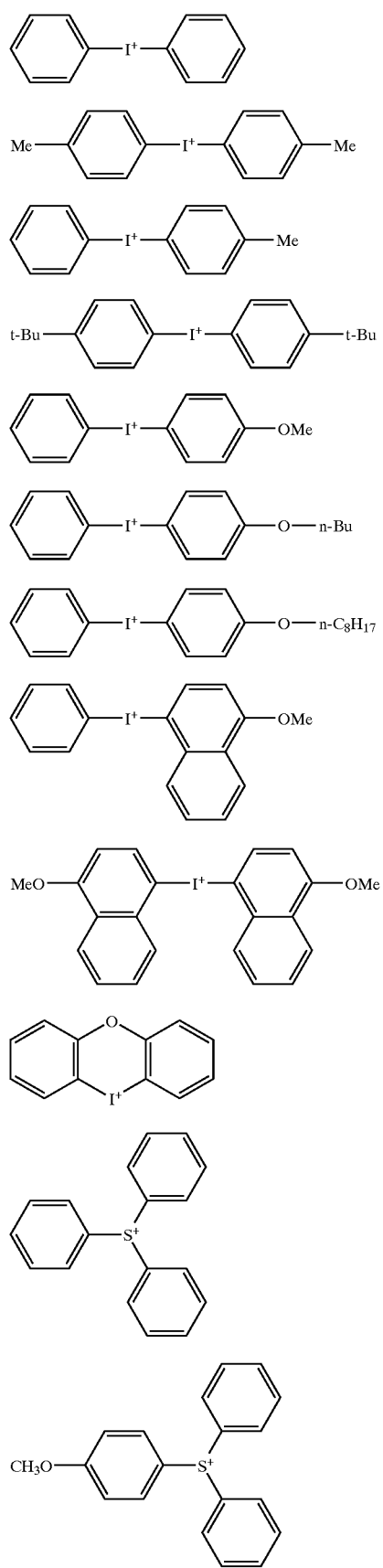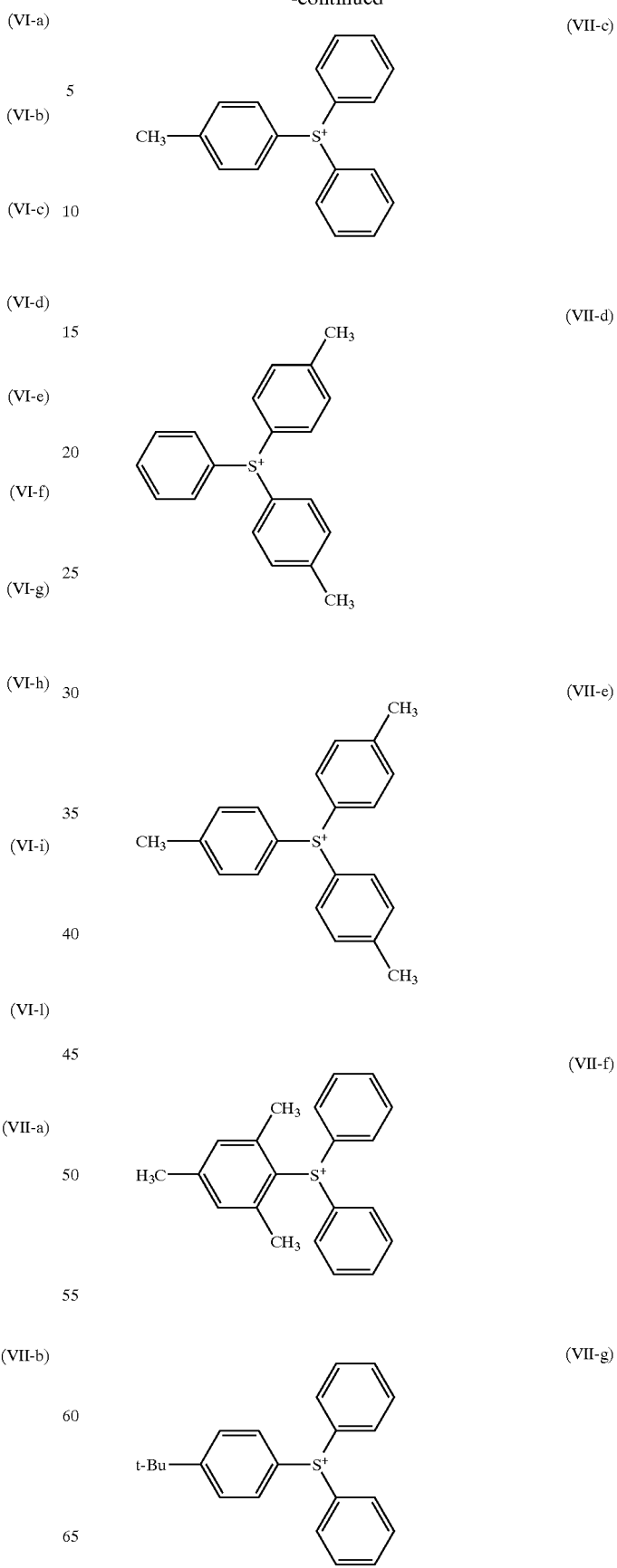

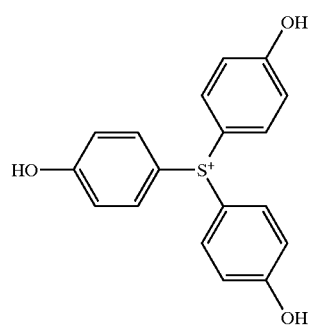 (VII-h)
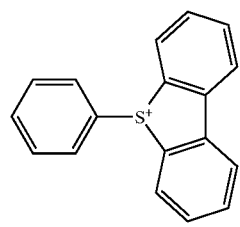 (VII-i)
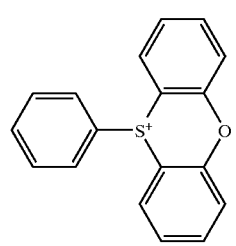 (VII-j)
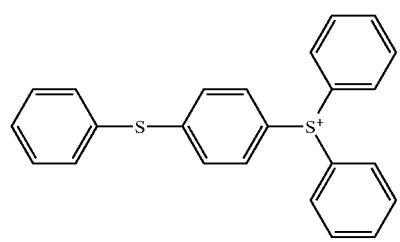 (VII-k)
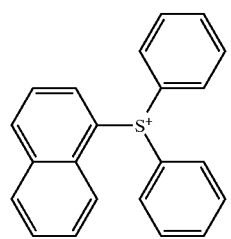 (VII-l)
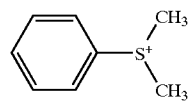 (VII-m)
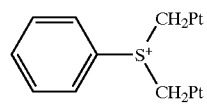 (VII-n)
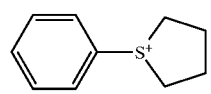 (VII-o)
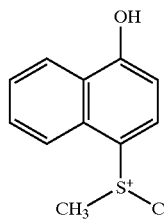 (VII-p)
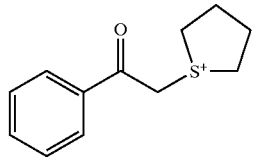 (VII-q)
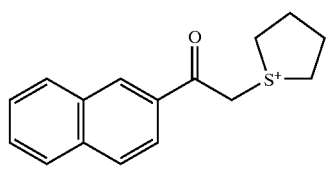 (VII-r)
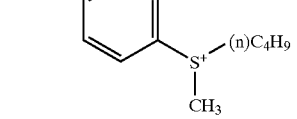 (VII-s)
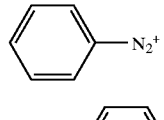 (VIII-a)
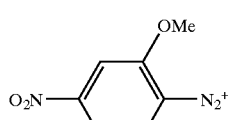 (VIII-b)
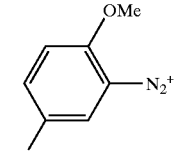 (VIII-c)
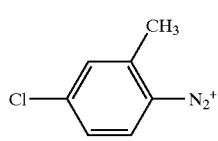 (VIII-d)
(VIII-e)
(VIII-f)

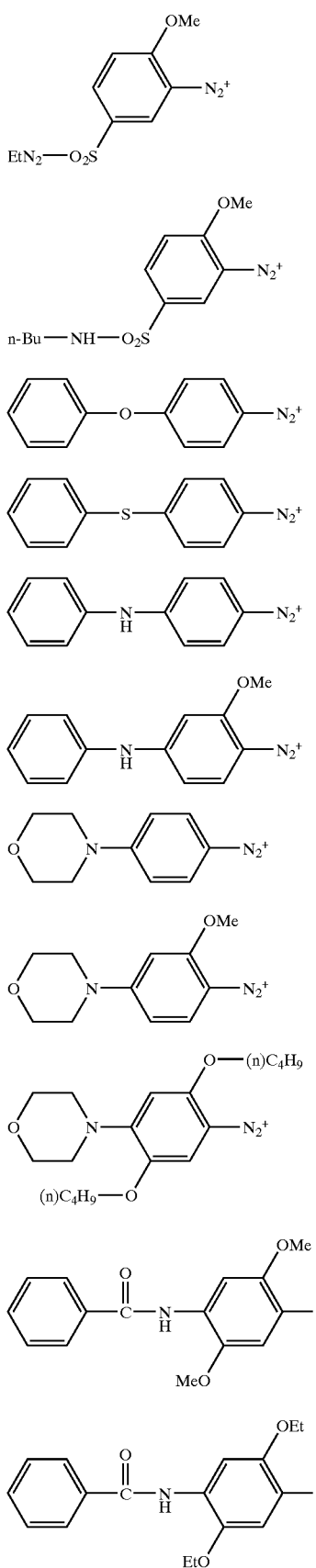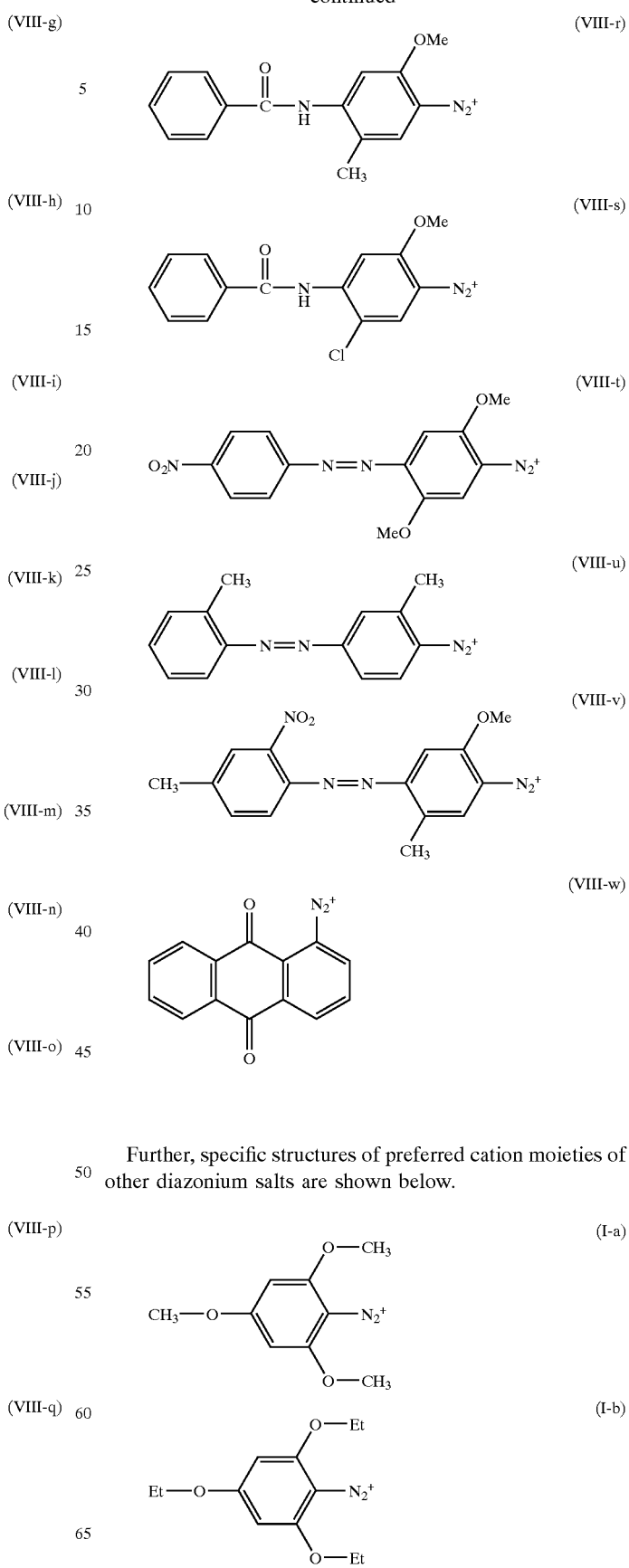
Further, specific structures of preferred cation moieties of other diazonium salts are shown below.

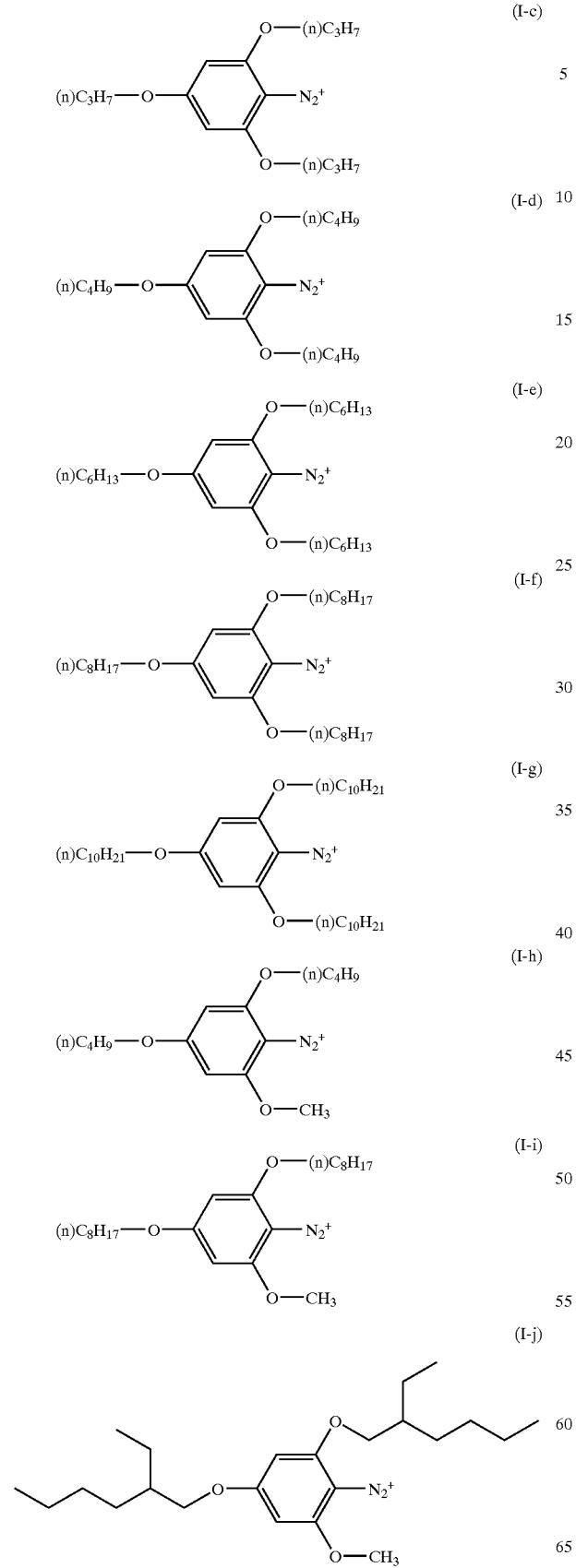

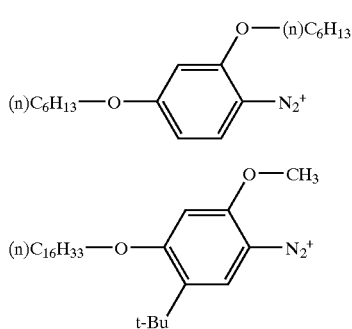

On the other hand, of the counter anions of the onium salts, examples of sulfonate ions particularly preferably used are enumerated below.
(1) methanesulfonate
(2) ethanesulfonate
(3) 1-propanesulfonate
(4) 2-propanesulfonate
(5) n-butanesulfonate
(6) allylsulfonate
(7) 10-camphorsulfonate
(8) trifuloromethanesulfonate
(9) pentafluoroethanesulfonate
(10) benzenesulfonate
(11) p-toluenesulfonate
(12) 3-methoxybenzenesulfonate
(13) 4-methoxybenaenesulfonate
(14) 4-hydroxybenzenesulfonate
(15) 4-chlorobenzenesulfonate
(16) 3-nitrobenzenesulfonate
(17) 4-nitrobenzenesulfonate
(18) 4-acetylbenzenesulfonate
(19) pentafluorobenzenesulfonate
(20) 4-dodecylbenzenesulfonate
(21) mesitylenesulfonate
(22) 2,4,6-triisopropylbenzenesulfonate
(23) 2-hydroxy-4-methoxybenzophenone-5-sulfonate
(24) dimethyl isophthalate-5-sulfonate
(25) diphenylamine-4-sulfonate
(26) 1-naphthalenesulfonate
(27) 2-naphthalenesulfonate
(28) 2-naphthol-6-sulfonate
(29) 2-naphthol-7-sulfonate
(30) anthraquinone-1-sulfonate
(31) anthraquinone-2-sulfonate
(32) 9,10-dimethoxyanthracene-2-sulfonate
(33) 9,10-diethoxyanthracene-2-sulfonate
(34) quinoline-8-sulfonate
(35) 8-hydroxyquinoline-5-sulfonate
(36) 8-anilino-naphthalene-1-sulfonate Further, salts of disulfonates as shown below and two equivalents of cations of the onium salts can also be used.
(41) m-benzenedisulfonate
(42) benzaldehyde-2,4-disulfonate
(43) 1,5-naphthalenedisulfonate
(44) 2,6-naphthalenedisulfonate
(45) 2,7-naphthalenedisulfonate
(46) anthraquinone-1,5-disulfonate
(47) anthraquinone-1,8-disulfonate
(48) anthraquinone-2,6-disulfonate
(49) 9,10-dimethoxyanthracene-2,6-disulfonate
(50) 9,10-diethoxyanthracene-2,6-disulfonate The onium salt sulfonate preferably used in the invention can be obtained by mixing a corresponding Cl⁻ salt or the like with a sulfonic acid or sodium or potassium sulfonate in water or a mixed solvent of water and a hydrophilic solvent such as an alcohol to conduct salt exchange.

The onium compound can be synthesized by known methods, for example, methods described in *Maruzen-Shin Jikken Kagaku Koza*, vol. 14-I, chapter 2•3 (p. 448), vol. 14-III, chapter 8•16 (p. 1838) and chapter 7•14 (p. 1564), J. W. Knapczyk et al., *J. Am. Chem. Soc.*, 91, 145 (1969), A. L. Maycok et al., *J. Org. Chem.*, 351, 2532 (1970), J. V. Crivello et al., *Polym. Chem. Ed.*, 18, 2677 (1980), U.S. Pat. Nos. 2,807,648 and 4,247,473, JP-A-53-101331 and JP-B-5-53166.

Preferred examples of the onium salt sulfonate preferably used as the acid generating agent in the invention are enumerated below.

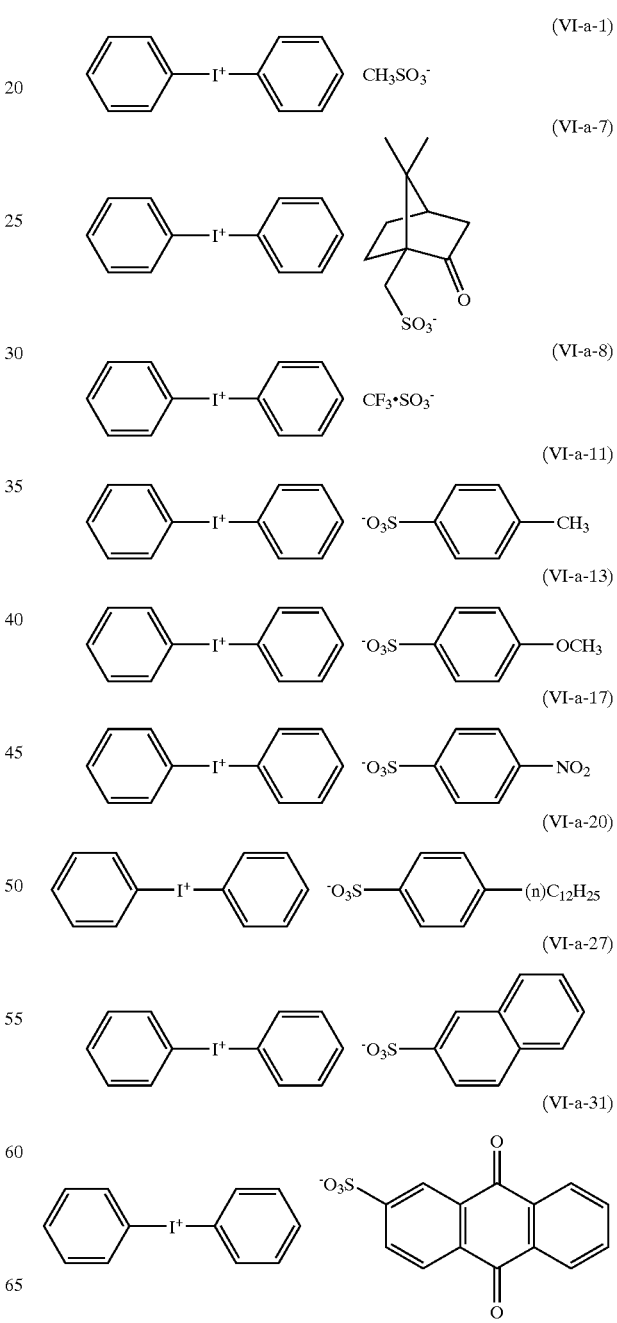

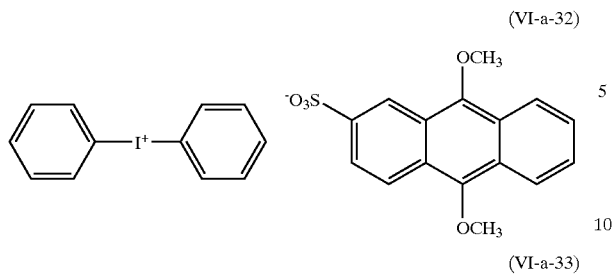
(VI-a-32)
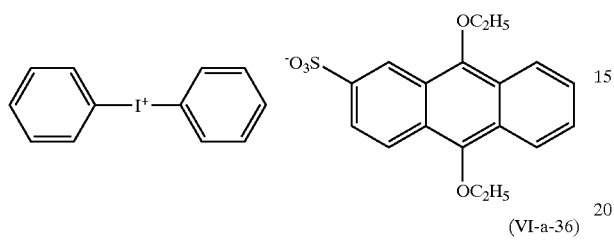
(VI-a-33)
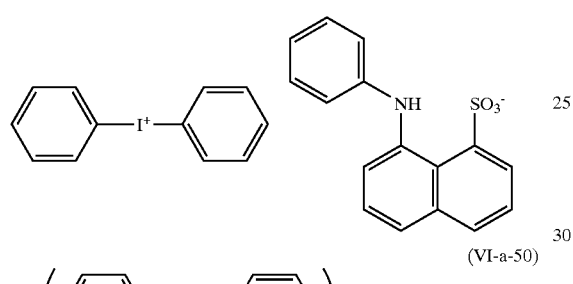
(VI-a-36)
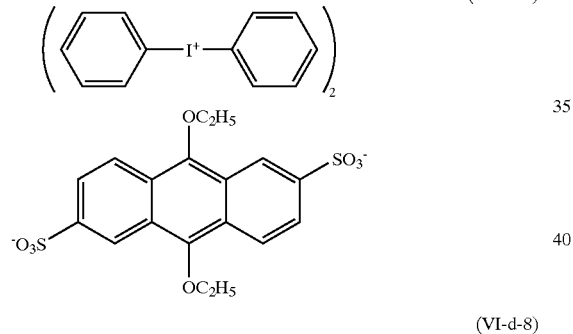
(VI-a-50)
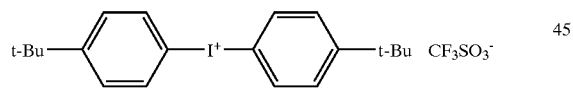
(VI-d-8)
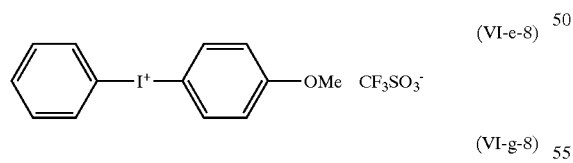
(VI-e-8)
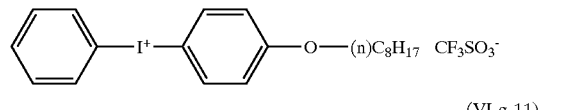
(VI-g-8)
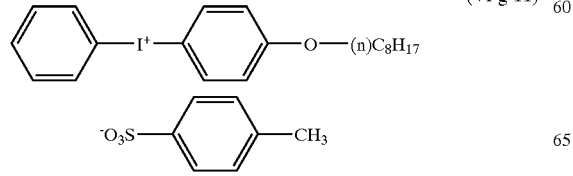
(VI-g-11)
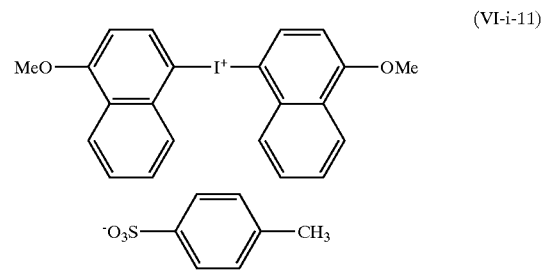
(VI-i-11)
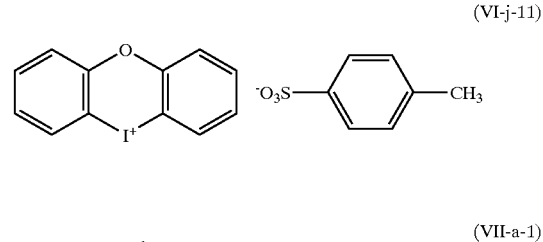
(VI-j-11)
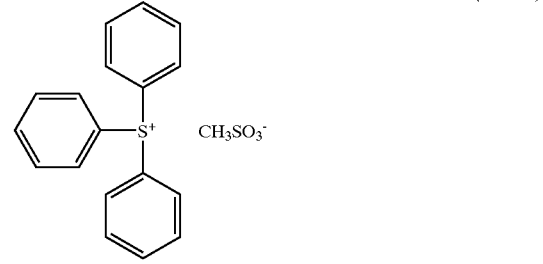
(VII-a-1)
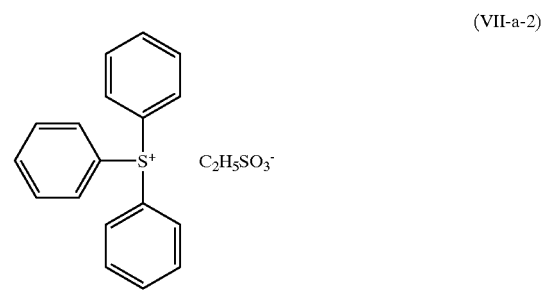
(VII-a-2)
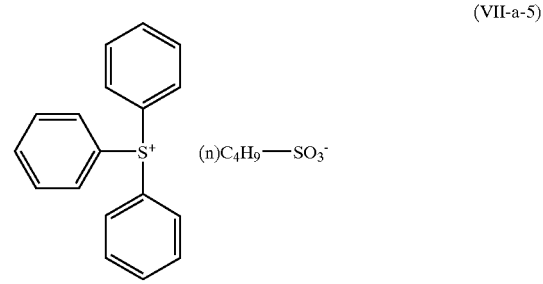
(VII-a-5)
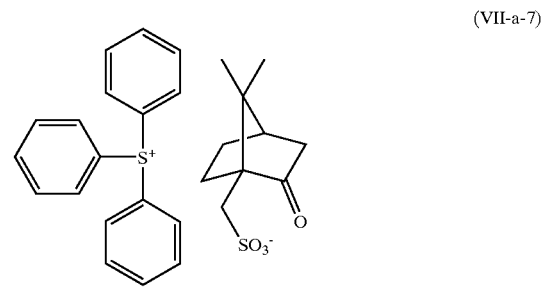
(VII-a-7)

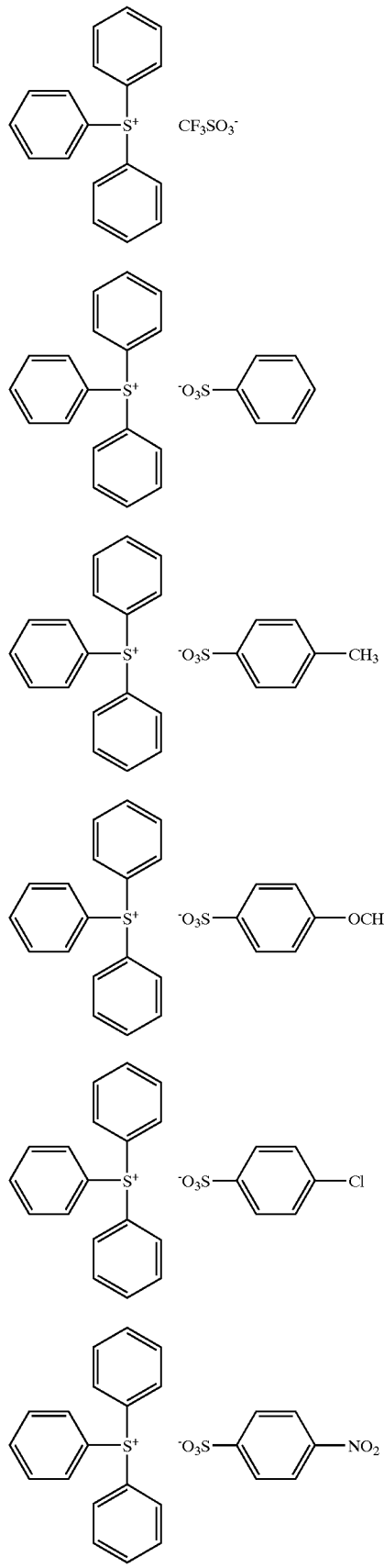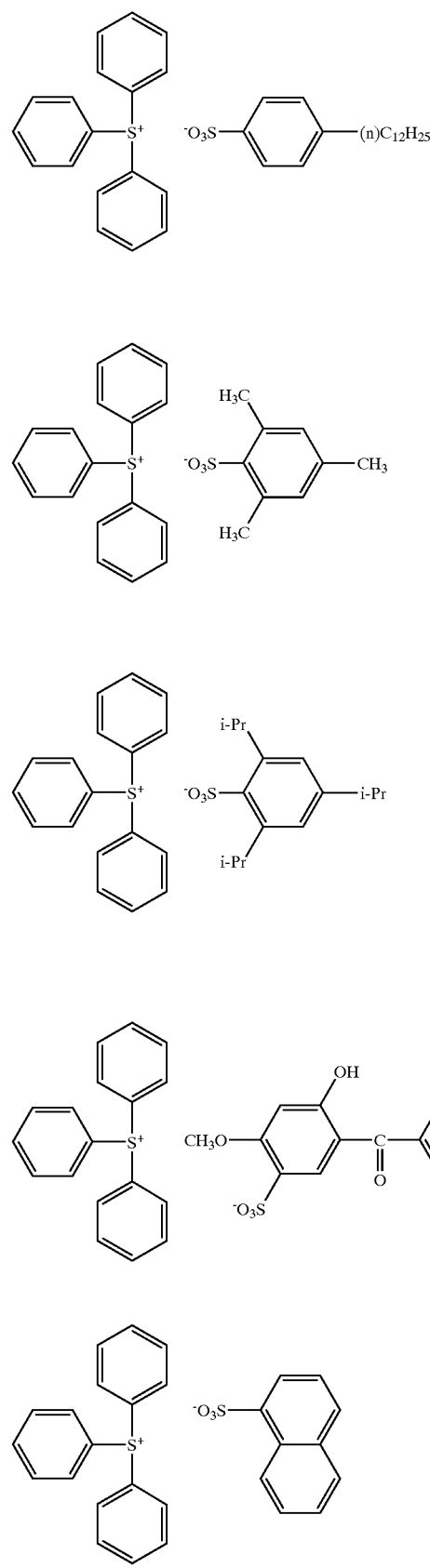

(VII-a-27)
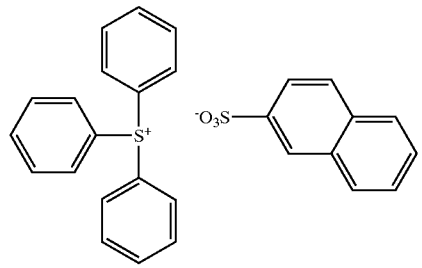
(VII-a-31)
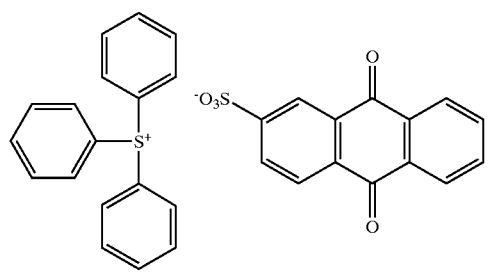
(VII-a-32)
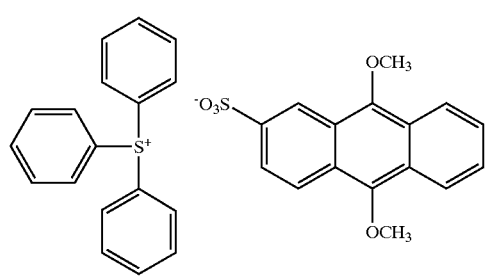
(VII-a-33)
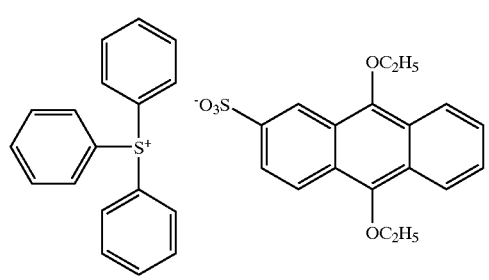
(VII-b-8)
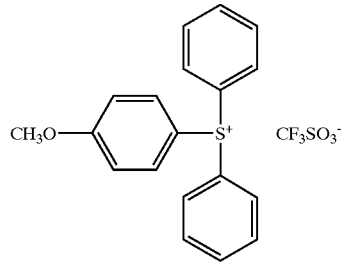
(VII-c-8)
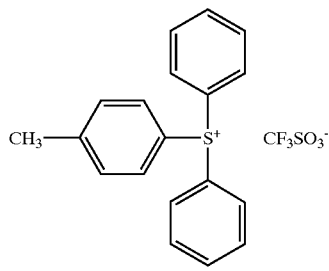
(VII-d-8)
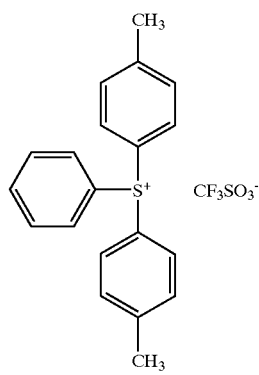
(VII-e-8)
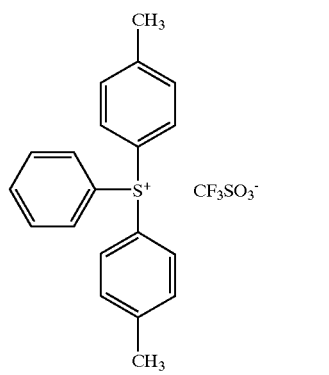
(VII-f-8)
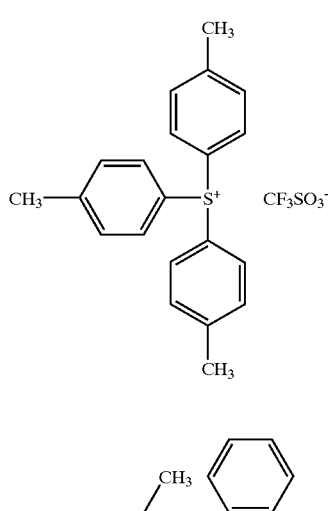
(VII-g-8)
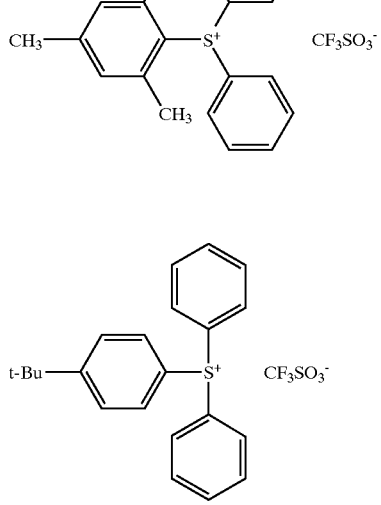

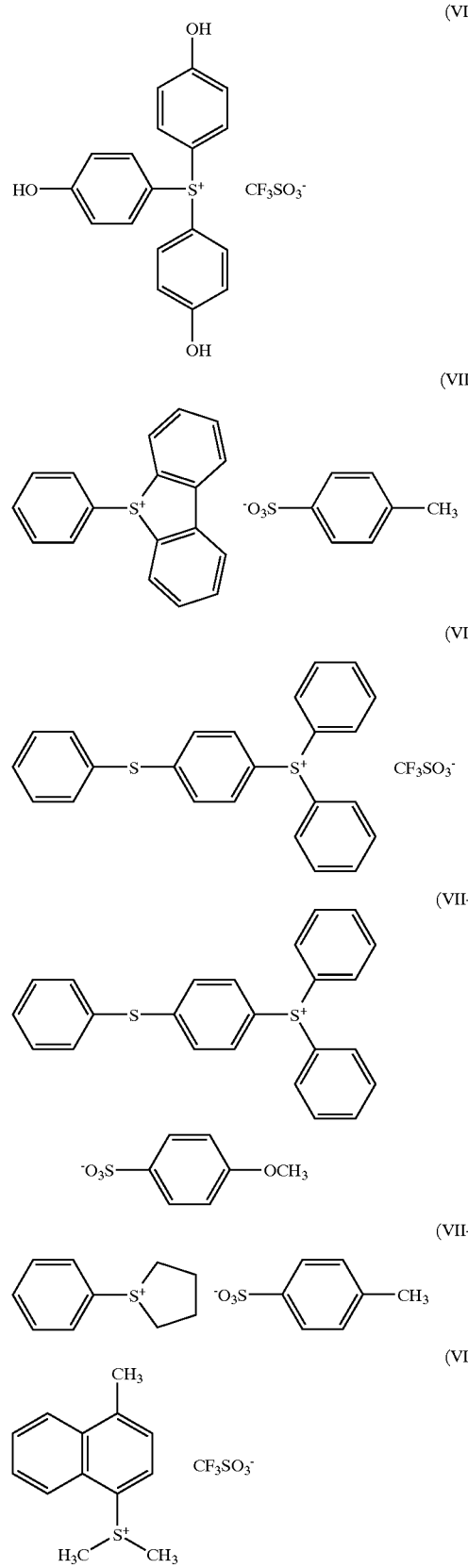
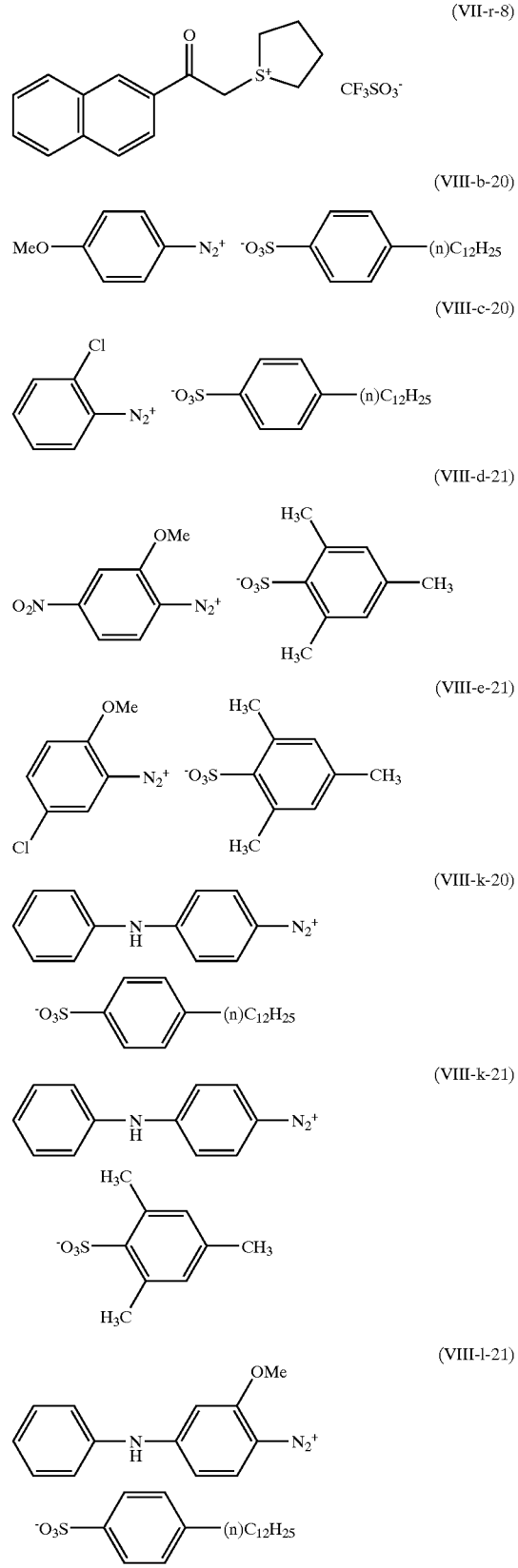

-continued

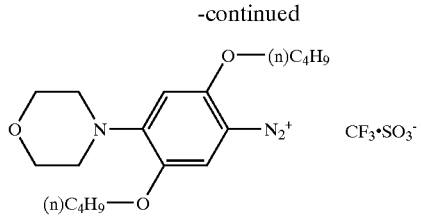
(VIII-o-8)

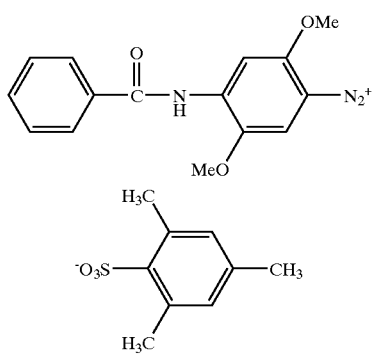
(VIII-p-21)

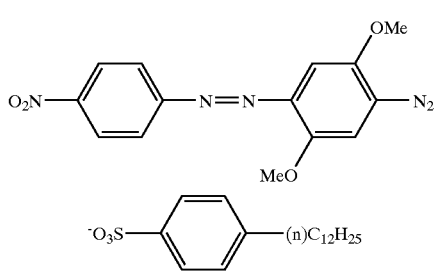
(VIII-t-20)

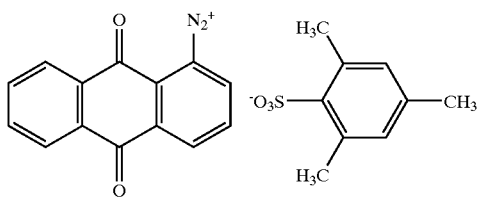
(VIII-w-21)

The acid generating agent is added to the intermediate layer composition in an amount of 0.01% to 50% by weight, preferably in an amount of 0.1% to 25% by weight, and more preferably in an amount of 0.5% to 20% by weight, based on the total solid content of the composition.

The acid generating agents may be used either alone or as a combination of two or more thereof.

(5) Solvent Used in the Invention (Component E)

The organic solvent for use in the invention includes, for example, ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, xylene, chlorobenzene, hexane, ethyl acetate, propyl acetate, butyl acetate, methyl lactate, ethyl lactate, methyl methoxypropionate, ethyl ethoxypropionate, methylpyruvate, ethyl pyruvate, propyl pyruvate, N,N-dimethylformamide, dimethyl sulfoxide, N-methylpyrrolidone and tetrahydrofuran.

The solvents may be used alone or as a combination of two or more thereof. The selection of the solvent is important, because it influences solubility, coating property and storage stability of the intermediate layer composition of the invention. Since water contained in the solvent influences various resist properties, it is preferred that the content of water in the solvent is small.

Of the solvents, cyclohexanone, 2-heptanone, propylene glycol monomethyl ether acetate, methyl methoxypropionate and butyl acetate are particularly preferred from the viewpoints of solubility and coating property.

(6) Surfactant (Component F)

The intermediate layer composition of the invention preferably contains one or more fluorine and/or silicon surfactants (including a fluorine surfactant, a silicone surfactant and a surfactant containing both of a fluorine atom and a silicon atom).

The composition of the invention containing the fluorine and/or silicon surfactant decreases a variation in coating film thickness on a wafer and forms no voids to provide a uniform coating film.

The fluorine and/or silicon surfactants include, for example, surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, U.S. Pat. Nos. 5,405,720, 5,360,692, 5,529,881, 5,296,330, 5,436,098, 5,576,143, 5,294,511 and 5,824,451. Commercially available surfactants can also be used as they are.

The commercially available surfactants which can be used include, for example, fluorine and/or silicone surfactants such as Eftop EF301 and EF303 (manufactured by Shin-Akita Kasei Co., Ltd.), Florad FC430 and FC431 (manufactured by Sumitomo 3M Ltd.), Megafac F171, F173, F176, F189 and R08 (manufactured by Dainippon Ink & Chemicals Inc.), Surflon S-382, SC101, SC102, SC103, SC104, SC105 and SC106 (manufactured by Asahi Glass Co., Ltd.) and Torysol S-366 (manufactured by Troy Chemical Corp.). Further, polysiloxane polymer KP-341 (manufactured by Shin-Etsu Chemical Co., Ltd.) can be used as the silicone surfactant.

The amount of the surfactant used is preferably from 0.0001% to 2% by weight, and more preferably from 0.001% to 1% by weight, based on the total amount of the intermediate layer composition (extruding a solvent).

In the invention, surfactants other than the above-mentioned fluorine and/or silicone surfactants can also be added. Specific examples of such surfactants include non-ionic surfactants such as polyoxyethylene alkyl ethers such as polyoxyethylene lauryl ether, polyoxyethylene stearyl ether, polyoxyethylene cetyl ether and polyoxyethylene oleyl ether; polyoxyethylene alkyl allyl ethers such as polyoxyethylene octyl phenol ether and polyoxyethylene nonyl phenol ether; polyoxyethylene-polyoxypropylene copolymers; sorbitan fatty acid esters such as sorbitan monolaurate, sorbitan mono-palmitate, sorbitan monostearate, sorbitan monooleate, sorbitan trioleate and sorbitan tristearate; and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate.

The surfactants may be added either alone or as a combination of two or more thereof.

Further, in the composition of the invention, it is preferred that metallic impurity such as metal or impurity ingredient such as a chlorine ion is reduced to 100 ppb or less. The presence of such impurities in a large amount unfavorably results in poor operation, defect and decreased yield in the fabrication of semiconductor device.

The solid content of the composition is preferably from 1% to 40% by weight, more preferably from 2% to 30% by weight, and still more preferably from 3% to 20% by weight, as the concentration of solid matter dissolved in the solvent.

In order to remove foreign matter, it is preferred that a solution prepared by dissolving the composition in the solvent is filtered through a filter having a pore size of about 0.05 to about 0.2 µm prior to use.

The composition of the invention can further contain a plasticizer, a dye and a spectral sensitizer.

The plasticizer, which can be used in the invention, includes compounds described in JP-A-4-212960, JP-A-8-262720, European Patents 735,422, 416,873 and 439,371, and U.S. Pat. No. 5,846,690. Specific examples thereof include di(2-ethylhexyl) adipate, n-hexyl benzoate, di-n-octyl phthalate, di-n-butyl phthalate, benzyl n-butyl phthalate and dihydroabiethyl phthalate.

The dye, which can be preferably used in the invention, includes oil dyes and basic dyes. Specific examples of such dyes include Oil Yellow #101, Oil Yellow #103, Oil Pink #312, Oil Green BG, Oil Blue BOS, Oil Blue #603, Oil Black BY, Oil Black BS and Oil Black T-505 (these dyes are manufactured by Orient Chemical Industries, Ltd.), Crystal Violet (CI42555), Methyl Violet (CI42535), Rhodamine B (CI45170B), Malachite Green (CI42000) and Methylene Blue (CI52015).

Preferred examples of the spectral sensitizer include benzophenone, p,p'-tetramethyldiaminobenzophenone, p,p'-tetraethylethylaminobenzophenone, 2-chlorothioxanthone, anthrone, 9-ethoxyanthracene, anthracene, pyrene, perylene, phenothiazine, benzyl, Acridine Orange, benzoflavin, Setoflavin-T, 9,10-diphenylanthracene, 9-fluorenone, acetophenone, phenanthrene, 2-nitrofluorene, 5-nitroacenaphthene, benzoquinone, 2-chloro-4-nitroaniline, N-acetyl-p-nitroaniline, p-nitroaniline, N-acetyl-4-nitro-1-naphthylamine, picramide, anthraquinone, 2-ethylanthraquinone, 2-tert-butylanthraquinone, 1,2-benzanthraquinone, 3-methyl-1,3-diaza-1,9-benzanthrone, dibenzalacetone, 1,2-naphthoquinone, 3,3'-carbonyl-bis(5,7-dimethoxycarbonylcoumarin and coronene, but the spectral sensitizer used is not limited to these compounds.

The spectral sensitizer can also be used as light absorber to absorb far ultraviolet light of a light source. In this case, the light absorber can reduce standing wave by reducing reflected light from the substrate to decrease the influence of multiple reflection in the resist film.

Although appropriate organic polymer film is used in the lower resist layer, various known photoresists may be used. For example, the FH series or FHi series manufactured by Fuji Film Arch Co., Ltd. or the PFI series manufactured by Sumitomo Chemical Co., Ltd. can be exemplified.

In the laminate of the invention, the lower resist layer is formed on a substrate. This layer is formed by dissolving the compounds contained in the lower resist layer in an appropriate solvent, and applying the resulting solution, for example, by a spin coat method or a spray method. The thickness of the lower resist layer is preferably from 0.1 to 4.0 µm, more preferably from 0.2 to 2.0 µm, and particularly preferably from 0.25 to 1.5 µm. The lower resist layer having a thickness of less than 0.1 µm is unfavorable from the viewpoints of antireflection and etching resistance. On the other hand, the lower resist layer having a thickness of more than 4.0 µm unfavorably causes the problem that the aspect ratio becomes too high, so that collapse of fine pattern formed tends to occur.

Then, the intermediate layer is formed. It is preferred that the lower resist layer is heat treated before the formation of intermediate layer. The temperature of the heat treatment is preferably from 150 to 250° C., more preferably from 170 to 240° C., and particularly preferably 180 to 230° C. When the temperature is lower than 150° C., intermixing with the lower resist layer is liable to occur in the formation of intermediate layer. On the other hand, the temperature exceeding 250° C. results in easy decomposition and deterioration of the polymer contained in the lower resist layer. Both are therefore unfavorable. The heat treatment can be conducted using a device such as a hot plate or a heat oven.

The time of the heat treatment varies depending on the above-described heat treatment temperature. For instance, when the heat treatment is conducted at a temperature of 180 to 230° C., the time is preferably within the range of 10 to 1,000 seconds, and more preferably within the range of 20 to 600 seconds. The time shorter than 10 seconds results in insufficient heat hardening and easy intermixing with the intermediate layer, whereas the time longer than 1,000 seconds results in decrease of the number of processed substrates. Both are therefore unfavorable.

Then, the intermediate layer is formed on the lower resist layer. It can be formed in the same manner as the above-described formation of the lower resist layer. The thickness of the intermediate layer is preferably from 0.02 to 0.6 µm, more preferably from 0.03 to 0.5 µm, and particularly preferably from 0.04 to 0.40 µm. The thickness less than 0.02 µm results in poor pattern transferring property to the lower resist layer or occurrence of pin holes in the coating film, whereas the thickness larger than 0.6 µm results in increase of dimensional shift by etching. Both are therefore unfavorable.

Then, the upper resist layer is formed. It is preferred that the intermediate layer is heat treated before the formation of upper resist layer. The temperature of the heat treatment is preferably from 150 to 250° C., more preferably from 170 to 250° C., and particularly preferably from 180 to 240° C. When the temperature is lower than 150° C., intermixing with the intermediate layer is liable to occur in the formation of the upper resist layer. On the other hand, the temperature exceeding 250° C. results in easy decomposition and deterioration of the polymer contained in the lower resist layer. Both are therefore unfavorable. The heat treatment can be conducted using a device such as a hot plate or a heat oven.

The time of the heat treatment varies depending on the above-described heat treatment temperature. For instance, when the heat treatment is conducted at a temperature of 180 to 230° C., the time is preferably within the range of 10 to 1,000 seconds, and more preferably within the range of 20 to 600 seconds. The time shorter than 10 seconds results in insufficient heat hardening and easy intermixing with the intermediate layer, whereas the time longer than 1,000 seconds results in the decrease of number of processed substrates. Both are therefore unfavorable.

Then, the upper resist layer is formed on the intermediate layer. It can be formed in the same manner as the above-described formation of the lower resist layer. The thickness of the upper resist layer is preferably from 0.03 to 0.6 µm, more preferably from 0.04 to 0.5 µm, and particularly preferably from 0.05 to 0.45 µm. The thickness less than 0.03 µm results in poor pattern transferring property to the intermediate layer or occurrence of pin holes in the coating film, whereas the thickness more than 0.6 µm results in poor lithographic performances. Both are therefore unfavorable. As the upper resist layer, it is possible to use a positive-working or negative-working resist suitable for each of the light sources of a near-ultraviolet light, KrF, ArF, $F_2$, EUV, EB and an X-ray.

The resulting three-layer resist is then subjected to a pattern formation process. As the first step thereof, the pattern formation treatment is conducted to the upper resist layer. Mask alignment is carried out, if desired, and a high-energy ray is irradiated through the mask, thereby making the irradiated portion of the resist layer soluble or insoluble in an aqueous alkali solution, followed by development with the aqueous alkali solution to form a pattern.

Then, as the second step, dry etching is conducted. This operation is carried out by $CHF_3$ gas plasma etching using the pattern of the above-described upper resist layer as a mask, thereby forming a fine pattern. The etching of the intermediate layer by the $CHF_3$ gas plasma etching is the same technique as plasma etching utilized in the conventional etching processing of a substrate such as an oxide film. The operation can be carried out by a cylindrical plasma etching apparatus using reactive gas, for example, $CHF_3$ gas or $CF_4$ gas as etching gas.

Then, as the third step, the lower resist layer is dry etched. This operation is carried out by oxygen plasma etching using the pattern of the above-described intermediate resist layer as a mask, thereby forming a fine pattern having a high aspect ratio. The etching of the organic polymer film by the oxygen plasma etching is the same technique as plasma etching utilized in separation of a resist film carried out after the termination of the conventional etching processing of a substrate by the photoetching operation. The operation can be carried out by a cylindrical plasma etching apparatus using reactive gas, for example, oxygen gas as etching gas. Mixed gas of oxygen gas and other gas such as sulfurous gas can also be used.

The present invention will be described in more detail with reference to the following examples, but the invention should not to be construed as being limited thereto.

SYNTHESIS EXAMPLE OF POLYMER

Synthesis Example 1

In 240 ml of toluene were dissolved 1.0 g (2.36 mmol) of PCOSI and 0.656 g (2.36 mmol) of 1,3-bis(phenylethynyl) benzene, and to the solution was added 24 µl of a xylene solution of platinum divinylsiloxane (Huls PCO72), followed by reacting at room temperature for 3 hours to obtain a polymer having Mw of 25,000 (Mn of 16,500). Then, Polymer A-1 having Mw of 22,700 (Mn of 11,000) was obtained by fractionation on a GPC column.

Synthesis Example 2

In 240 ml of toluene were dissolved 1.0 g (2.36 mmol) of PCOSI and 0.656 g (2.36 mmol) of 1,4-bis(phenylethynyl) benzene, and to the solution was added 24 µl of a xylene solution of platinum divinylsiloxane (Huls PCO72), followed by reacting at room temperature for 3 hours in the same manner as in Synthesis Example 1 to obtain Polymer A-2 having Mw of 39,000 (Mn of 22,000).

Examples 1 to 5 and Comparative Example 1
(1) Formation of Lower Resist Layer

An FHi-028DD resist (a resist for i-line manufactured by Fuji Film Olin Co., Ltd.) was applied onto a 6-inch silicon wafer with a Mark 8 spin coater manufactured by Tokyo Electron Ltd., and baked at 90° C. for 90 seconds to obtain a uniform film having a thickness of 0.55 µm.

The film was further heated at 200° C. for 3 minutes to obtain a lower resist layer having a thickness of 0.40 µm.
(2) Formation of Intermediate Layer A solution for intermediate layer having each composition shown in Table 1 was prepared, and the resulting solution was subjected to microfiltration through a membrane filter having a pore size of 0.1 µm to obtain an intermediate layer composition.

The intermediate layer composition was similarly applied onto the above-described lower resist layer with a spin coater, and heated at 200° C. for 5 minutes to obtain an intermediate layer having a thickness of 0.10 µm.

(3) Formation of Upper Resist Layer

A solution for upper resist layer having the composition shown below was prepared, and the resulting solution was subjected to microfiltration through a membrane filter having a pore size of 0.1 µm to obtain an upper resist layer composition.

The upper resist layer composition was similarly applied onto the above-described intermediate layer with a spin coater, and heated at 120° C. for 90 seconds to obtain an upper resist layer having a thickness of 0.30 µm.

The wafer thus prepared was exposed using a 9300 ArF excimer stepper manufactured by ISI Co., Ltd., on which a resolution mask was mounted, while changing the exposure amount.

Then, the wafer was heated in a clean room at 120° C. for 90 seconds, thereafter developed with a tetramethylammonium hydroxide developing solution (2.38% by weight) for 60 seconds, rinsed with distilled water, and dried to obtain a pattern (upper pattern). The wafer having the upper layer pattern was etched (dry developed) by use of a parallel plate type reactive ion etching apparatus, DES-245R, manufactured by Plasma System Co. to form a pattern on the intermediate layer. The etching gas was $CHF_3$, the pressure was 30 mTorr, and the application power was 100 mW/cm². The pattern formed was observed under a scanning electron microscope.

(Preparation of Solution for Upper Resist Layer)

Polymer: 11.6 g

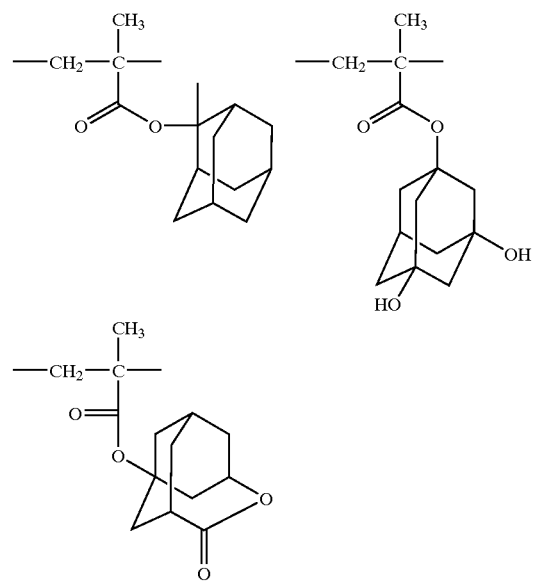

Acid Generating Agent: 0.36 g

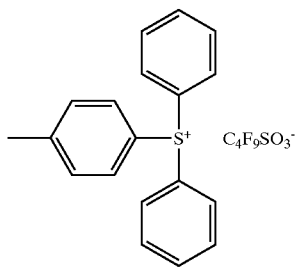

Basic Compound: 0.024 g
1,5-Diazabicyclo[4.3.0]non-5-ene
Surfactant: 0.01 g
Megafac F-176 (manufactured by Dainippon Ink & Chemicals Inc.)
Solvent: 88 g
Propylene glycol monomethyl ether acetate The cross-sectional shape of the upper layer pattern and line edge roughness (LER) after etching of the intermediate layer using the upper layer pattern as a mask were evaluated by the following methods:

(1) Cross-Sectional Shape of Upper Layer Pattern

After patterning of the upper layer resist, the cross-sectional shape of the upper layer pattern was observed by a scanning electron microscope (S-4200 manufactured by Hitachi, Ltd.).

(2) Line Edge Roughness (LER)

After etching of the intermediate layer, the size of 120-nm lines (line/space=1/1) was measured (point of measurement: 30 points) at different positions (30 positions) on the 6-inch silicon wafer by a scanning electron microscope (S-9200 manufactured by Hitachi, Ltd.), and the dispersion of (found value—120 nm) was determined, followed by calculation of 3σ. The smaller the value is, the better the LER is.

(3) Storage Stability of Coating Solution for Intermediate Layer

The rate of change in film thickness immediately after the preparation of the coating solution for the intermediate layer and after the storage thereof at 40° C. for 1 week (accelerated test) was measured. The smaller the rate of change (%) is, the better the storage stability is.

Component (B), Component (C), Component (D), Component (E) and Component (F) used herein are shown below.

B-1: 2,2'-Azobis(2,4-dimethylvaleronitrile)

C-1:

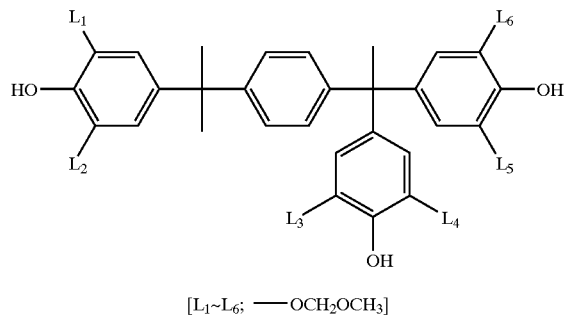

[L$_1$~L$_6$; —OCH$_2$OCH$_3$]

D-1:

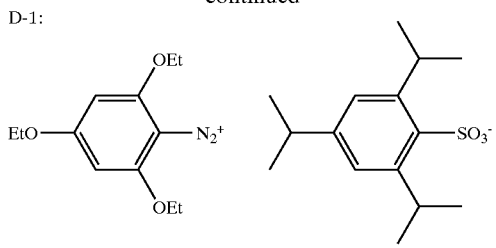

E-1: Propylene glycol monomethyl ether acetate
E-2: 2-Heptanone
E-3: Cyclohexanone
E-4: Methyl methoxypropionate
E-5: Butyl acetate
F-1: Megafac R08 (manufactured by Dainippon Ink & Chemicals Inc.)

<Intermediate Layer Used in Comparative Example 1>

An intermediate layer used in Comparative Example 1 was prepared according to a method described in Japanese Patent No. 2,901,044.

(Preparation of Coating Solution for Intermediate Layer of Comparative Example 1)

Compound shown below (Mw: 20,000): 19 g

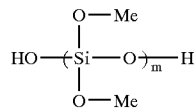

Acid generating agent: 0.825 g

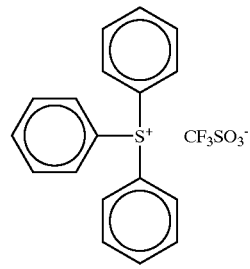

Monochlorobenzene: 178 g

A wafer for comparison was prepared in the same manner as above except for using the coating solution for the intermediate layer of Comparative Example 1 and conducting light exposure with an Xe—Hg lamp for 5 minutes after the application of the coating solution for the intermediate layer of Comparative Example 1. The wafer was evaluated in the same manner as above.

TABLE 1

| Example | Component A | Component B | Component C | Component D | Component E | Component F |
|---|---|---|---|---|---|---|
| 1 | A-1 (1.0 g) | B-1 (0.01 g) | — | — | E-1 (19 g) | — |
| 2 | A-2 (1.0 g) | — | C-1 (0.12 g) | D-1 (0.04 g) | E-2 (19 g) | — |
| 3 | A-1 (1.0 g) | — | — | | E-3 (19 g) | F-1 (0.006 g) |
| 4 | A-2 (1.0 g) | — | — | | E-4 (19 g) | — |
| 5 | A-1 (1.0 g) | B-1 (0.01 g) | C-1 (0.12 g) | D-1 (0.04 g) | E-5 (19 g) | F-1 (0.006 g) |

TABLE 2

| Example | Storage Stability of Coating Solution for Intermediate Layer | Shape of Resist Pattern of Upper Layer | LER after Etching of Intermediate Layer (nm) |
|---|---|---|---|
| 1 | 0.7% | Rectangular | 3 |
| 2 | 0.9% | Rectangular | 2 |
| 3 | 0.6% | Rectangular | 5 |
| 4 | 0.5% | Rectangular | 7 |
| 5 | 0.9% | Rectangular | 3 |
| Comparative Example 1 | 15% | Footing Profile | 25 |

From the results of evaluation in Examples 1 to 5 and Comparative Example 1, it can be seen that the intermediate layer material composition for a three-layer resist process and the pattern formation method using the same according to the invention are excellent in storage stability of the coating solution for intermediate layer and also provide extremely excellent performance in the shape of the upper-layer resist pattern and the LER after etching of the intermediate layer, compared with the comparative example.

According to the invention, there are provided the intermediate layer composition for a three-layer resist process, which is soluble in an organic solvent, excellent in the storage stability, and has no problem with regard to the footing profile and line edge roughness in patterning of the upper resist, and the pattern formation method using the intermediate layer composition.

The entire disclosure of each and every foreign patent application from which the benefit of foreign priority has been claimed in the present application is incorporated herein by reference, as if fully set forth herein.

While the invention has been described in detail and with reference to specific embodiments thereof, it will be apparent to one skilled in the art that various changes and modifications can be made therein without departing from the spirit and scope thereof.

What is claimed is:

1. An intermediate layer composition for a three-layer resist process comprising (A) an octakis(silsesquioxane) skeleton-containing polymer obtained by hydrosilylation polymerization of a compound represented by the following formula (I) with a compound represented by the following formula (II) in the presence of a platinum-containing catalyst:

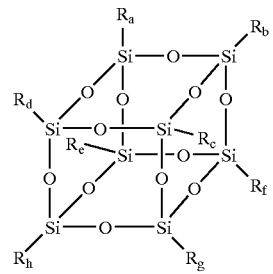

(I)

wherein $R_a$ to $R_h$ each independently represent a hydrogen atom, a halogen atom or an alkyl group, and at least two of $R_a$ to $R_h$ are hydrogen atoms;

$$R_1-C{\equiv}C-(R_2)_a-C{\equiv}C-R_3 \quad (II)$$

wherein $R_1$ and $R_3$ each independently represent a monovalent organic or organometallic group, $R_2$ represents a bivalent organic or organometallic group, and a represents 0 or 1.

2. The intermediate layer composition as claimed in claim 1, wherein the polymer of component (A) is obtained by hydrosilylation polymerization of pentacyclo[9.5.1.1$^{3,9}$.1$^{5,15}$.1$^{7,13}$] octasiloxane (PCOSI) with the bis (substituted ethynyl) compound represented by formula (II) in a molar ratio of 2:1 to 1:4 in the presence of a platinum-containing catalyst.

3. The intermediate layer composition as claimed in claim 1, which further comprises (B) a radical initiator.

4. The intermediate layer composition as claimed in claim 1, which further comprises (C) a crosslinking agent.

5. The intermediate layer composition as claimed in claim 1, which further comprises (D) a compound generating an acid by heat.

6. The intermediate layer composition as claimed in claim 1, which further comprises (E) a solvent.

7. The intermediate layer composition as claimed in claim 1, which further comprises (F) a surfactant.

8. A pattern formation method comprising the steps of:
   (a) forming a lower resist layer containing an organic material on a substrate;
   (b) applying an intermediate layer on the lower resist layer;
   (c) applying an upper resist layer containing an organic material crosslinkable or decomposable by radiation exposure on the intermediate layer;

(d) forming a pattern on the upper resist layer; and
(e) successively etching the intermediate layer, the lower resist layer and the substrate;

wherein the intermediate layer comprises the intermediate layer composition as claimed in claim 1.

9. The pattern formation method as claimed in claim 8, which further comprises the step of backing the intermediate layer to insolubilize in an organic solvent.

* * * * *